US009409265B2

(12) United States Patent
Whitesides et al.

(10) Patent No.: US 9,409,265 B2
(45) Date of Patent: Aug. 9, 2016

(54) THREE DIMENSIONAL ASSEMBLY OF DIAMAGNETIC MATERIALS USING MAGNETIC LEVITATION

(75) Inventors: George M. Whitesides, Cambridge, MA (US); Filip Ilievski, Santa Clara, CA (US); Audrey Ellerbee, Palo Alto, CA (US); Sergey S. Shevkoplyas, Friendwood, TX (US); Katherine A. Mirica, Waltham, MA (US)

(73) Assignee: President and Fellows of Harvard College, Cambridge, MA (US)

( * ) Notice: Subject to any disclaimer, the term of this patent is extended or adjusted under 35 U.S.C. 154(b) by 409 days.

(21) Appl. No.: 13/994,595

(22) PCT Filed: Dec. 20, 2011

(86) PCT No.: PCT/US2011/066169
§ 371 (c)(1),
(2), (4) Date: Jan. 10, 2014

(87) PCT Pub. No.: WO2012/088119
PCT Pub. Date: Jun. 28, 2012

(65) Prior Publication Data
US 2014/0123461 A1    May 8, 2014

Related U.S. Application Data

(60) Provisional application No. 61/425,023, filed on Dec. 20, 2010.

(51) Int. Cl.
*C30B 30/04*    (2006.01)
*B23P 19/04*    (2006.01)
(Continued)

(52) U.S. Cl.
CPC . *B23P 19/04* (2013.01); *B03C 1/01* (2013.01); *B03C 1/288* (2013.01); *B81C 3/005* (2013.01);
(Continued)

(58) Field of Classification Search
CPC ............ B81C 3/00; B81C 1/28; C30B 30/04; Y10S 117/901
See application file for complete search history.

(56) References Cited

U.S. PATENT DOCUMENTS

| 3,788,465 | A  | 1/1974 | Reimers et al. |
| 6,902,065 | B2 | 6/2005 | Kimura et al. |
| 2007/0215553 | A1 | 9/2007 | Yellen et al. |

FOREIGN PATENT DOCUMENTS

| WO | WO-2005/105314 A1 | 11/2005 |
| WO | WO-2009/108047 A1 | 9/2009 |

OTHER PUBLICATIONS

Yellen et al. "Arranging matter by magnetic nanoparticle assemblers", Proceedings of the National Academy of Sciences of The United States of America, vol. 102, No. 25, Jun. 21, 2005, pp. 8860-8864, XP002677233.*

(Continued)

*Primary Examiner* — Robert M Kunemund
(74) *Attorney, Agent, or Firm* — Wilmer Cutler Pickering Hale and Dorr LLP

(57) ABSTRACT

The ability to assemble three-dimensional structures using diamagnetic particles suspended in solutions containing paramagnetic cations is described. The major advantages of this separation device are that: (i) it is a simple apparatus that does not require electric power (a set of permanent magnets and gravity are sufficient for the diamagnetic separation and collection system to work); ii) the assembled structures can be removed from the paramagnetic solution for further processing after fixing the structure; iii) the assembly is fast; and iv) it is small, portable.

24 Claims, 19 Drawing Sheets

(51) Int. Cl.
*B03C 1/01* (2006.01)
*B03C 1/28* (2006.01)
*B81C 3/00* (2006.01)

(52) U.S. Cl.
CPC ............. *C30B 30/04* (2013.01); *B03C 2201/18* (2013.01); *B81C 2203/054* (2013.01); *B81C 2203/057* (2013.01); *B81C 2203/058* (2013.01); *Y10S 117/901* (2013.01); *Y10T 29/49826* (2015.01)

(56) References Cited

OTHER PUBLICATIONS

Chetouani H et al: "Diamagnetic Levitation of Beads and Cells Above Permanent Magnets", Solid-State Sensors, Actuators and Microsystems Conference, 2887. Transducers 2887. International, IEEE, Piscataway, N J, USA,Jun. 18, 2887 (2887-86-18), pp. 715-718, XP831216138.*

Akiyama, Yoshitake, and Morishima, Keisuke, "Spheriod Array Formation by Non-label Cell Manipulation Using Magneto-Archimedes Effect," Micro-Nanomechatronics and Human Science, 2011 International Symposium, pp. 45-50 XP032073643 (Nov. 6, 2011) (6 pages).

Catherall, A.T., et al., "Cryogenically enhanced magneto-Archimedes levitation," New Journal of Physics, vol. 7, No. 1, XP020092841 (May 1, 2005) (11 pages).

Feinstein, E., et al., "Three-dimensional self-assembly of structures using the pressure due to a ferrofluid in a magnetic field gradient," Journal of Applied Physics, vol. 99, pp. 064901-1-064901-6 (2006) (6 pages).

Hirota, N., et al., "Magneto-Archimedes levitation and its application," RIKEN Review, No. 44, pp. 159-161 (Feb. 2002) (3 pages).

Ilievski, Filip, et al., "Templated self-assembly in three dimensions using magnetic levitation," Soft Matter, vol. 7, No. 19, pp. 9113-9118, XP002677235 (Oct. 7, 2011) (6 pages).

International Search Report and Written Opinion Issued by the European Patent and Trademark Office as International Searching Authority for International Application No. PCT/US2011/066169 mailed Jul. 3, 2012 (12 pages).

Mirica, K.A., et al., "Using Magnetic Levitation for Three Dimensional Self-Assembly," Advanced Materials, vol. 23, No. 36, pp. 29-45, XP002677234 (Sep. 22, 2011) (17 pages).

* cited by examiner

THREE DIMENSIONAL ASSEMBLY OF DIAMAGNETIC MATERIALS USING MAGNETIC LEVITATION

RELATED APPLICATIONS

The present application is a national stage application of International Patent Application No.: PCT/US2011/066169, filed on Dec. 20, 2011, which claims the benefit of the earlier filing date of U.S. patent application Ser. No. 61/425,023, filed Dec. 20, 2010, the contents of which are incorporated by reference in their entirety.

GOVERNMENT SUPPORT

This work was supported by the United States government under the following grants: DARPA award number W911NF-08-1-0143. These agencies may have certain rights in this invention.

FIELD OF THE INVENTION

Three-dimensional assembly of mesoscale components are described. In particular, three-dimensional self-assembly of mesoscale components using magnetic levitation (MagLev), that control both the position and orientation of the components, is described.

BACKGROUND

The problem of how best to use self-assembly (SA) to organize meso-scale components into three-dimensional (3D) assemblies is unsolved: such structures tend to be dominated by gravitational forces, rather than by interaction between the components. In fact, there are no general strategies for assembly in 3D, other than those involving mechanical processes, such as the use of machines directed or programmed by humans. Self-assembly in 3D at the molecular scale is, of course, ubiquitous, but these processes operate under different constraints than those for larger objects: the molecular forces experienced by thermal collisions—Brownian motion—are larger than forces due to gravity, and molecules remain suspended in solution indefinitely.

In the laboratory, processes based on self-assembly, are most successful at surfaces (e.g., in two dimensions). Examples at different scales include the assembly of ordered monolayers of alkanethiolates (SAMs) on gold, of colloid particles into crystals and photonic band-gap structures of bubbles into crystalline bubble rafts, of microspheres into ordered arrays and of chips onto credit cards. The presence of a templating surface both simplifies and limits self-assembly. In general, the most successful laboratory demonstrations of self-assembly use a single kind of a simple component (e.g., uniform spheres), such as crystals of spheres that have been explored actively for use in photonics, optics, and electronics. There are, of course many elegant examples of self-assembled molecules and molecular aggregates (for example, molecular crystals, liquid crystals, phase-separated block copolymers, proteins, and protein segregates). The processes that generate these structures are, however, not easily subject to design or adapted to non-molecular components, and the most "elementary" of them (e.g., crystallization of simple organic molecules from non-polar solvents) still seem intractably difficult to model or simulate.

SUMMARY

In certain embodiments, methods of assembling two or more objects into a three-dimensional structure is described. In certain embodiments, the method includes introducing two or more diamagnetic objects into a paramagnetic solution, the paramagnetic solution comprising a paramagnetic material in a solvent; and applying a magnetic field to the paramagnetic solution to assemble the two or more objects into a three-dimensional structure. In certain embodiments, each of the two or more objects has an overall density that levitates the components in a particular height within said magnetic field and at least one of the objects have a non-uniform density profile that orients the components in a particular orientation within said magnetic field.

In certain embodiments, the method further includes a template in the paramagnetic solution near said two or more objects that provides a surface against which the two or more objects assemble.

In certain embodiments, the template is a mechanical template that surrounds the two or more objects.

In certain embodiments, the template is a mechanical template that displaces the two or more objects from occupying the natural equilibrium position within said magnetic field.

In certain embodiments, the method further includes providing an annealing force during said applying a magnetic field to the paramagnetic solution.

In certain embodiments, the annealing force comprises mechanical agitation.

In certain embodiments, the method further includes affixing the two or more objects together after said applying a magnetic field.

In certain embodiments, the affixing comprises providing a binding agent that binds the two or more objects.

In certain embodiments, the binding agent comprises a photocurable agent, said method further comprising exposing said two or more objects and said photocurable agent to irradiation to bind said two or more objects.

In certain embodiments, the affixing comprises removing the magnetic field that allows the plurality of components to interlock with each other.

In certain embodiments, the affixing comprises draining the paramagnetic solution that allows the two or more objects to interlock with each other.

In certain embodiments, the method further includes subjecting the assembly to a new set of assembly conditions after said applying a magnetic field.

In certain embodiments, the modifying comprises providing a different magnetic field.

In certain embodiments, the modifying comprises providing a different gravitational field relative to the magnetic field.

In certain embodiments, the two or more objects are assembled to form an optical device.

In certain embodiments, the at least one of the two or more objects include non-rigid components.

In certain embodiments, the object having a non-uniform density profile is adjusted to have a predetermined density profile to obtain a desired tilt after said applying a magnetic field.

In certain embodiments, methods of assembling two or more objects into a three-dimensional structure is described. In certain embodiments, the method includes introducing two or more diamagnetic objects and a template into a paramagnetic solution, the paramagnetic solution comprising a paramagnetic material in a solvent; and applying a magnetic field to the paramagnetic solution to assemble the two or more objects. In certain embodiments, each of the two or more objects has an overall density that levitates the components in a particular height within said magnetic field.

In certain embodiments, a plurality of spherical objects are introduced into the paramagnetic solution.

In certain embodiments, the template is a mechanical template that surrounds the two or more objects.

In certain embodiments, the template is a mechanical template that displaces the two or more objects from occupying the natural equilibrium position within said magnetic field.

In certain embodiments, the method further includes providing an annealing force during said applying a magnetic field to the paramagnetic solution.

In certain embodiments, the annealing force comprises mechanical agitation.

In certain embodiments, the two or more diamagnetic objects comprise a plurality of spheres and said annealing force increases packing order and density of the plurality of spheres.

DETAILED DESCRIPTION

Figure 1A:
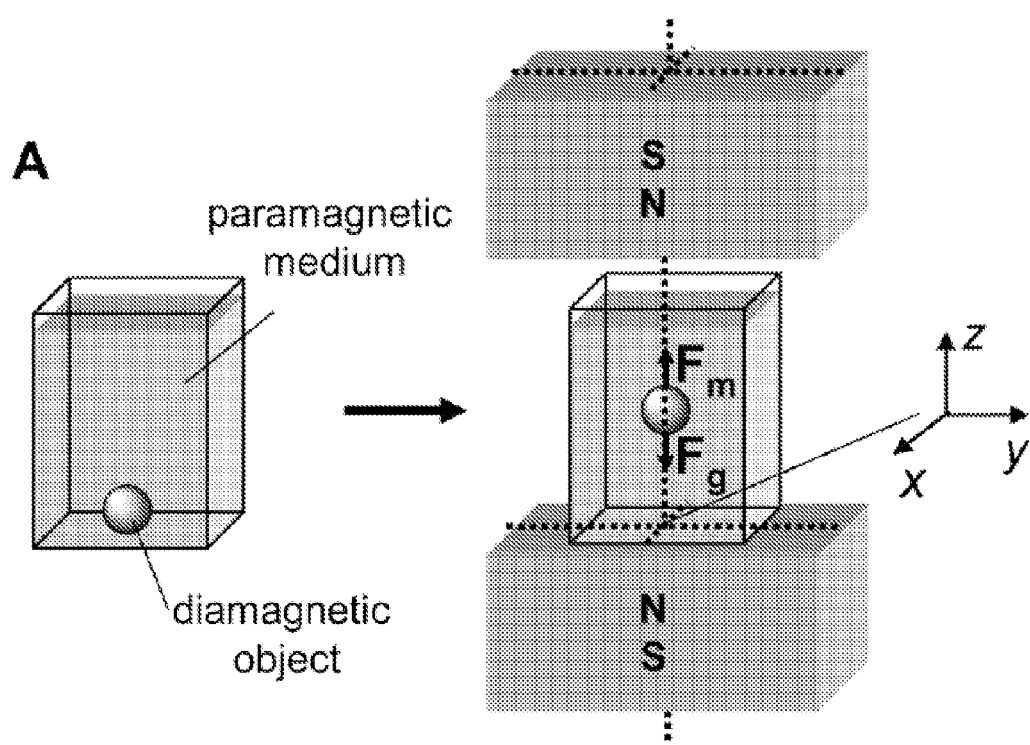
FIG. 1A through 1C shows schematics of experimental design for MagLev in accordance with certain embodiments.

The present disclosure provides techniques for self-assembly of objects into three-dimensionally ordered structures, that are arranged in desired locations and orientations based on density and the relative influence of magnetic and gravitational forces.

Particularly, the present disclosure describes various strategies for self-assembly in 3D of diamagnetic objects (μm to meter in sizes) supported in a paramagnetic fluid under influence of a magnetic field. The magnetic field and its gradient levitate the objects, template their self-assembly, and direct the shape of the assembled cluster. Objects suspended in the paramagnetic medium and positioned between the two magnets assemble and orient spontaneously. The final position of the objects in the liquid, and their self-assembly, is directed by a competition between gravitational forces, magnetic forces, and steric interactions (mechanical forces from physical contact) among and between the objects and the container.

In the last decade, the magnetic levitation of diamagnetic materials has become more accessible to standard laboratory facilities as the early experimental setup consisting of superconducting magnets (>10 T) and a pressurized oxygen atmosphere has been replaced by small rare-earth magnets and aqueous paramagnetic salt solutions. One of the characteristics of magnetic levitation is that there is an equilibrium position in a magnetic field in which an object is stably levitated. When a levitating object in magnetic fields is moved away from a position of equilibrium, a restoration force on the object returns it to equilibrium position. This stable point is determined by its volume magnetic susceptibility and density. Therefore, different substances levitated in the same magnetic field have different equilibrium positions of levitation and can thus be separated. Magnetic levitation (MagLev) has previously been used to separate materials based on differences in density and for measuring density of materials.

Principles Underlying MagLev

FIG. 1 summarizes the principles that underlie MagLev. The device used is simple: two permanent magnets oriented with like poles facing each other (in an anti-Helmholtz configuration), and separated by a container containing a paramagnetic medium (e.g., aqueous solution of $MnCl_2$). FIG. 1A shows the balance of magnetic ($F_m$) and gravitational ($F_g$) forces that determines the vertical equilibrium position of an object levitating within the MagLev device. In this geometry, the $B_x$ and $B_y$ components of the magnetic field are exactly zero only along the axis of the magnets, that is, along the vertical dashed line in FIG. 1A, as confirmed by the completely vertical orientation of the force along this axis. The $B_z$ component of the magnetic field also becomes zero over this axis, but only at the midpoint between the two magnets. The effect of the magnetic force in this geometry is to attract the paramagnetic solution towards one or the other of the two magnets and, as a consequence, to trap all diamagnetic particles at the central region between the magnets (FIG. 1B)—i.e., where B is close to zero. An object whose density is greater than the levitating solution and that would otherwise sink to the bottom of the container outside the magnetic field will float or 'levitate' in the paramagnetic solution when placed in a magnetic field. Objects with differences in density of no more than 0.05 g/cm³, or even densities with accuracies of ±0.0001 g/cm³ can be detected or distinguished.

Objects that have a non-uniform density profile will orient in the magnetic field based on the local densities within the object. As used herein, a "non-uniform density profile" is meant to describe materials having a density profile so that a torque can be applied to the material upon application of the magnetic field as to induce an observable orientation about at least one axis of the Cartesian coordinate system (e.g., z-axis that is perpendicular to the faces of magnets). For example, the density of the material may change abruptly or gradually or regularly throughout the material to induce an orientation. In certain embodiments, "non-uniform density profile" refers to a material wherein the density is uniform, but the shape of the object is such that an observable orientation can be induced upon application of the magnetic field.

Figure 1B:
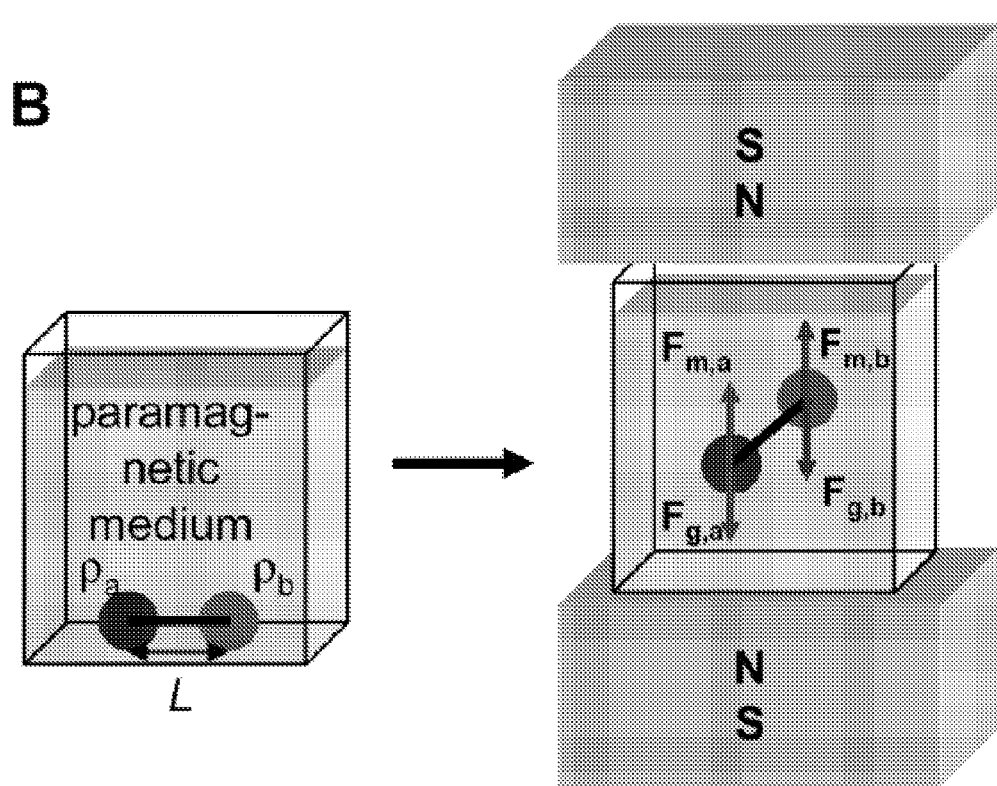

FIG. 1B demonstrates that the distribution of densities within an object can be used to program its tilt angle during magnetic levitation. FIG. 1B illustrates the tilted orientation of a heterogeneous (non-uniform density) object in a magnetic field. The composite object of heterogeneous density is considered to include two non-overlapping components a and b having a density of $\rho_a$ and $\rho_b$ respectively whose centers of mass are connected by a massless rod of length L. FIG. 1B also provides a three dimensional reference point with respect to the x-, y- and z-axes. The system of coordinates can be set such that the Z-axis coincides with the centerline (the line connecting the centers of the two magnets), the origin is in the center of the top surface of the bottom magnet, and the YZ plane contains the centers of mass of both components of the composite object. Each component a and b of the object experiences both a gravitational force ($F_{g,a}$ and $F_{g,b}$, respectively) and a magnetic buoyancy force (($F_{m,a}$ and $F_{m,b}$, respectively) that results in different equilibrium positions in the magnetic field. The two components pivot around an imaginary pivot point such that at equilibrium, the net force acting on the object and the torque around any pivot point approaches zero. As illustrated in FIG. 1B, this results in a tilt angle θ, defined as the angle between the Z-axis (vertical direction) and the link connecting the centers of mass of the two components comprising the object.

Figure 1C:
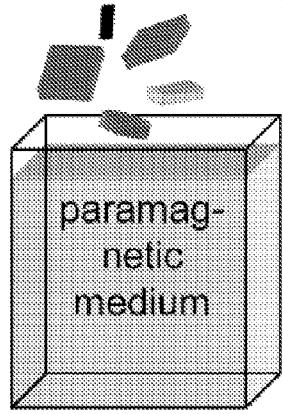
Figure 1C:
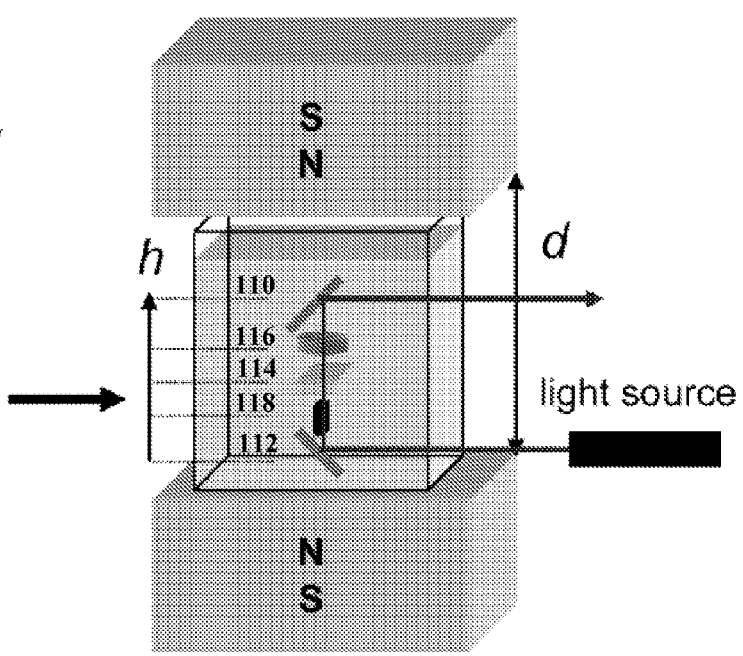

The factors that dictate the height and tilt of a levitated object can be used to assemble objects of different shapes, densities and density profiles into complex three dimensional assemblies. FIG. 1C shows a schematic of a complex assembly with designed function where each component levitates in a specific 3D configuration, both in terms of its vertical position and orientation, determined by the magnetic and gravitational forces acting on it. Thus for example, the objects include plates 110 and 112 that have average densities that cause them to levitate at different heights and density distributions that cause them to tilt in opposite directions, plate 114 and disk 116 of homogeneous density that levitate without tilt in the magnetic field (but a different heights due to their different densities), and disk 118 that orients perpendicular to the direction of the magnetic field.

The condition of static equilibrium in MagLev for each object can be summarized as follows: i) the net force acting on the object equals zero (Eq. A), and ii) the net torque around any arbitrary pivot point equals zero (Eq. B). In these equations, $F_g$(N) is the force of gravity, $F_m$(N) is the magnetic force acting on the object, and r is the lever arm vector (a vector from the pivot point to the point of application of force).

$$\vec{F}_g + \vec{F}_m = \vec{0} \tag{A}$$

$$\vec{r} \times (\vec{F}_g + \vec{F}_m) = \vec{0} \tag{B}$$

To simplify the derivations, an object of heterogeneous density is approximated with a composite object (subscript c) comprising two non-overlapping parts (subscripts a and b) of homogeneous densities whose centers of mass connect by a massless rod of length L(m). (The magnetic susceptibilities of the two parts of the composite object are assumed to be identical). In a 3D Cartesian coordinate system in which the Z-axis is aligned with the direction of the vector of gravity and coincides with the centerline (the line connecting the centers of the two magnets), the origin is in the center of the top surface of the bottom magnet, and the YZ-plane contains the centers of mass of both parts of the composite object. Eq. C gives h(m), the distance between the top surface of the bottom magnet and the center of volume of the object (the "levitation height" of the composite object), and Eq. D gives θ, the angle of tilt of the composite object in the YZ-plane (defined as the angle between the Z-axis and the link connecting the centers of mass of the two components comprising the object).

$$h = \frac{d}{2} + \frac{(\rho_c - \rho_m) g \mu_0}{\alpha_z^2 (\chi_c - \chi_m)} \tag{C}$$

$$\theta = \cos^{-1} \frac{(\rho_b - \rho_a) g \mu_0}{(\chi_c - \chi_m)(\alpha_y^2 - \alpha_z^2) L} \tag{D}$$

In these equations, $\rho_a$ (kg/m³) and $\rho_b$ (kg/m³) are the densities of the two parts of the composite object, $\rho_c$ (kg/m³) is the average density of the composite object, $\rho_m$ (kg/m³) is the density of the paramagnetic medium, $\chi_c$ (unitless) is the magnetic susceptibility of the object, $\chi_m$ (unitless) is the magnetic susceptibility of the paramagnetic medium, g(m/s²) is the acceleration due to gravity, $\mu_o = 4\pi \times 10^{-7}$ (N/A²) is the magnetic permeability of free space, d(m) is the distance between the magnets, $\alpha_y$ is the gradient of the Z-component of the magnetic field along the Z-axis, B is the magnitude of the magnetic field (A/m), and V is the volume of the sample (m³).

These requirements can be utilized for static equilibrium to organize the components in 3D. The gravitational force acting on an individual component can be controlled by controlling the average density of the component and the density of the fluid, and by patterning the distribution of density within the component. For a particular system with fixed values of magnetic parameters (magnetic field and magnetic field gradient, magnetic susceptibilities) and a medium of constant density, the average density of an object of heterogeneous density determines its levitation height at equilibrium (Eq. C); the pattern of density or density distribution within the object defines the orientation of the object relative to the axis of gravity (Eq. D). The gradient of magnetic field and the densities of components can be utilized to control the vertical and lateral position of levitating objects, as well as their orientation.

Three-Dimensional Assembly of Diamagnetic Objects

MagLev can be utilized to guide the self-assembly of components in 3D. In certain embodiments, a stationary magnetic field can suspend objects against gravity, and the shape of the magnetic field gradient can guide them into contact with one another, and determine the shape of the levitating clusters. Any object of regular shape, such as spherical, cuboidal, tetrahedral, octahedral, prismatic, and the like, or even any irregular shape may be used, provided that it is diamagnetic and of a density that permits its levitation in a magnetic field. Suitable materials are not soluble in the solvent and do not swell to any considerable extent in the solvent. In some embodiments, the material is a polymer, ceramic, metal, or composite object. In certain embodiments, objects of density between 0.9 and 3 g/cm$^3$ can be levitated. In some embodiments, the objects can have a uniform density profile, an asymmetric density profile, patterned density profile, or any irregular density profile. The density profile may be chosen so that the object levitates at a particular orientation within the applied magnetic field.

Figure 1D:
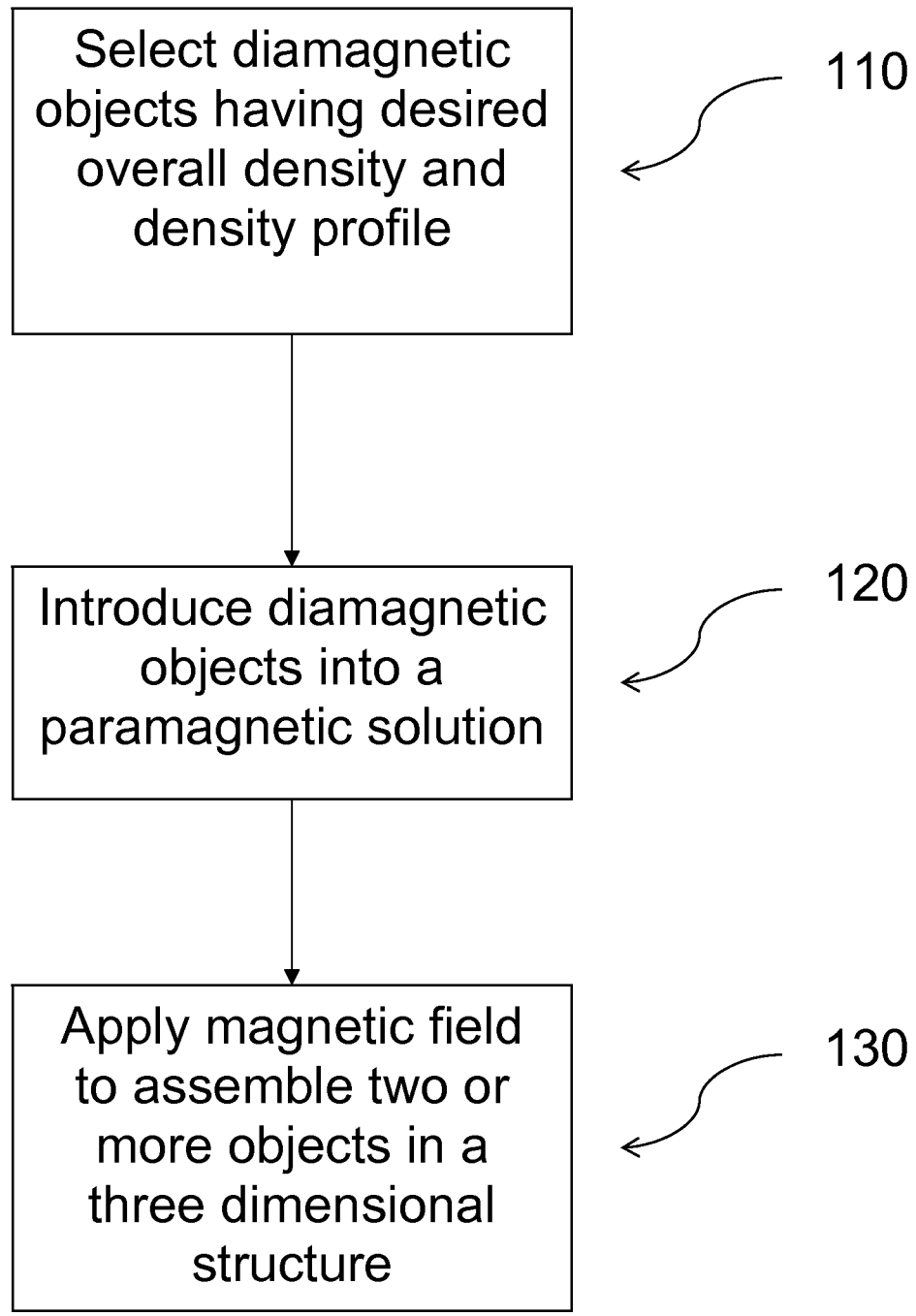
FIG. 1D shows flow chart diagram of assembling two or more objects into a three dimensional structure in accordance with certain embodiments.

As shown in FIG. 1D, 3D assembly of two or more objects can be carried out by first selecting two or more diamagnetic objects that have a desired overall density and density profile (see step 110).

Then, 3D assembly can be further carried out by introducing the two or more diamagnetic objects into a paramagnetic solution, where the paramagnetic solution includes a paramagnetic material (e.g., paramagnetic salt) in a suitable solvent (see step 120).

Then, a magnetic field can be applied to the paramagnetic solution to assemble the two or more objects into a three-dimensional structure (see step 130).

In certain embodiments, manipulating the density of the objects can control the vertical position of levitating objects in MagLev. For example, the simultaneous levitation of multiple objects with different densities can enable the assembly of 3D assemblies, (e.g., multilayered structures) that are levitating in different heights within the paramagnetic solution.

In certain embodiments, orientation of the objects can be controlled by providing or fabricating components with non-uniform (e.g., pre-programmed) density profiles. Any arbitrary shape having a particular density profile (e.g., stacked layers of different materials, materials having a distribution of material density, etc.) can be utilized to position the material in a desired orientation. Whereas the overall density of the object can predominantly determine the levitation height of the object, the object's particular density profile can predominantly determine the orientation of the object levitating at a particular height.

It should be noted that objects having a spherical geometry can also have a density profile that orients the spherical object in a desired orientation. For example, the spherical object can possess local density differences that cause the spherical object to rotate preferentially in within the applied magnetic field.

Figure 10:
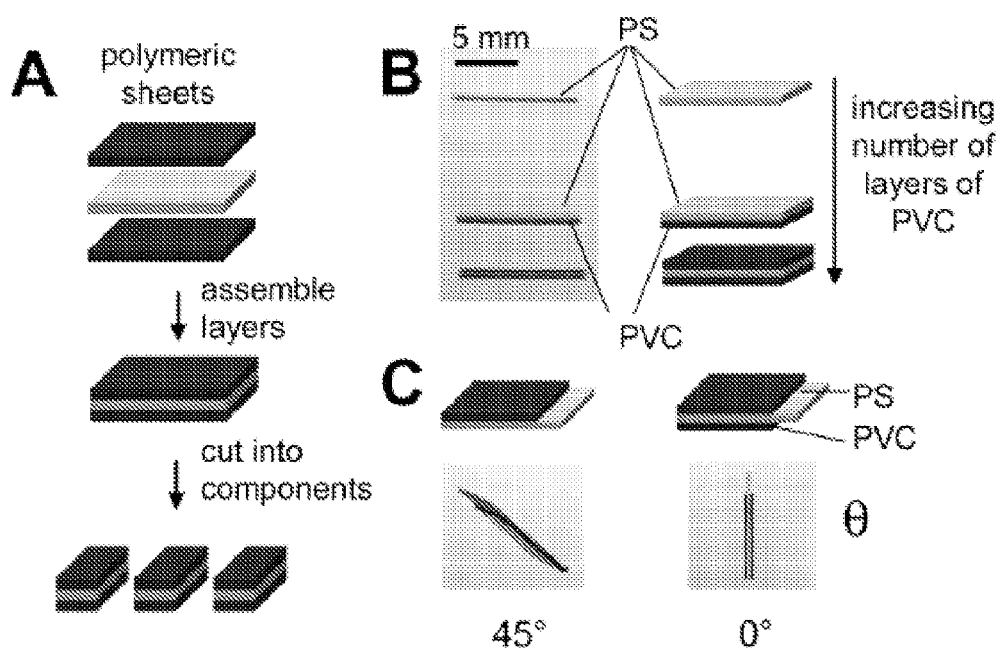
FIG. 10A-C shows schematics and photographs showing formation of components having desired patterned density that can lead to different orientation in the MagLev device in accordance with certain embodiments.

In some embodiments, objects can be formed by combining various different sub-parts together to obtain objects having a desired density and density profile. For example, objected having a desired density profile can be formed by stacking different layers of same or different density to provide objects that levitate at desired heights and at desired orientation. The different layers can be joined together using adhesives, tapes, clips, and the like. Particularly, objects can be designed to levitate at 0, 45, 90, or any other desired angles relative to the z-axis by designing the density distribution of the object appropriately. For example, a rectangular flat object comprising two equal layers can orient horizontally (at 90 degrees to the z-axis) such that the less dense layer is facing down (see, e.g., FIG. 10B). The same geometry, but with the more dense layer spanning only part of the length can produce an object that will levitate oriented at 45 degrees relative to the z axis (see, e.g., FIG. 10 C, left). A flat sheet with two denser layers sandwiching a less dense layer and spanning part of the length can orient vertically, or at 0 degrees relative to the z-axis (see, e.g., FIG. 10B right) Hence, objects of known density and density profile that are known to exhibit desired levitation height and orientation and can be utilized to form 3D assembled structures.

In certain embodiments, rather than using objects with known density and density profile, objects with unknown density and density profile can be introduced into the MagLev device. Then, the orientation and levitation height of each of the objects can be measured. Thereafter, based on the measurements, the desired two or more objects can be selected and introduced into the paramagnetic solution and the magnetic field can be applied to assemble the two or more objects based on the measured height and orientation of the individual objects.

In some embodiments, the magnetic field can be removed to cause the objects levitating at different heights and different orientation to collapse and stack onto each other. In certain embodiments, the objects can be designed so that the objects interlock with each other as they collapse and stack onto each other. Alternatively, rather than removing the magnetic field, the paramagnetic solution can be drained to achieve the similar results.

In addition, in certain embodiments, adhesives can be added so that the assembled structures can be retained once the magnetic field is removed. For example, freely-levitating clusters or multi-component structures can be joined or affixed together by suitable techniques, such as the addition of a photocurable or thermally curable adhesive in the paramagnetic solution, during, before, or after the structure has been formed in the magnetic field. Suitable photocurable adhesives include epoxide-, mercapto ester- or methacrylate-based adhesives. For example, Norland Optical Adhesive 72 or similar photocurable adhesives can be utilized. In some other example, the objects may be softened and sintered together. Then, the joined or affixed structures can then be removed from the paramagnetic solution with the 3D self-assembled structure intact.

In some other embodiments, to induce order in the levitating components, or to influence the shape of the components (e.g., to make non-close-packed based cluster), templates can be placed in contact with the levitating components. Tailoring the size and shape of the templates can promote the formation of alternate packing of components. Without wishing to be bound by theory, templates that promote ordered structures by self-assembly can generally have well-defined edges (either physical or energetic), can possess a smooth magnetic gradient, and can promote the formation of crystalline clusters within the well-defined edges.

Some suitable exemplary templates include one or more flat surfaces, such as one or more sides of the container walls (e.g., see FIGS. 3, 4, and 7), "enveloping templates" that surround the objects, such as rigid three-sided, four-sided, circular, ellipsoidal hollow core materials (e.g. see FIG. 5), "displacing templates" that displace the objects from their natural equilibrium height and orientation, such as other spheres, notched spheres, and the like (e.g., see FIGS. 5 and 6), and the like.

In certain embodiments, the two or more objects may have a uniform density profile (e.g., spherical object having a uniform density profile) and, hence, do not form a preferential orientation within the applied magnetic field. Conventionally, such spherical objects were observed to form disordered aggregates, where no long-range order was observed. However, such objects having a uniform density profile can nevertheless be assembled into three-dimensional structures by providing a template that induces formation of well-ordered structures, such as a cubic or close-packed structures. For example, by calculating the number of spheres that can fit within a container wall, ordered structures, such as close packed spheres or cubic packed spheres, can be formed. Desired number of spheres having a desired density can pack in one structure levitating at one height, a second desired number of spheres having a second desired density can pack in the same or different structure levitating at a second height, and the like. Accordingly, complex three-dimensional structures can be formed. Exemplary structures that can be formed using such templates are shown in FIGS. 3 through 7, as will be discussed in greater detail below.

In certain embodiments, annealing can be carried out to arrange the components into desired structures. For example, mechanical agitation can be used to anneal the components (e.g., clusters of components) into the desired structures. Other annealing forces can include heat, flow of the paramagnetic solution, sound waves, alternating magnetic fields and the like.

In certain embodiments, the magnetic field distribution can be altered using, for example, different magnet geometries, magnet-to-magnet distance, magnetic field strength, and different arrangement of the magnets that can further change the levitation height and orientation of the individual components. For example, the magnetic field strengths may be diffused by separating the magnet further apart. Use of rectangular, circular, square magnets can further change the lateral magnetic field distribution. Non-parallel orientation of the magnet faces can alter the magnetic field distribution further. All of these changes in the magnetic field can change the assembled structures as the magnetic field distribution and minimum can affect the objects' interaction with the gravitational field, thereby altering the levitation height and the torque applied (i.e., orientation). Complicated magnetic field distributions can be simulated using a commercial software such as COMSOL. Alternatively, without knowing the precise magnetic field distribution, experiments can be carried out following certain trends (e.g., increasing magnet-to-magnet distribution spreads out the magnetic field along the z-axis) to guess and verify the resulting structure. Accordingly, different 3D self-assembled structures can be formed using the same set of objects as they can respond differently to the applied magnetic field.

In certain embodiments, rather than changing the magnetic field distribution, the gravitational field relative to the magnetic field distribution can be altered to further affect the levitation height and orientation of the objects, leading to further changes in the assembled structures. For example, by tilting the MagLev device, the z-axis can become non-parallel to the direction of gravity and the objects can assemble in entirely different structures. Again, the objects can levitate and orient according to the principle that the sum of all torque and forces experienced by the object is zero.

In certain embodiments, the choice of paramagnetic solution can be altered to provide different buoyancy force and/or different magnetic field distribution within the paramagnetic solution. A paramagnetic salt is added to form the paramagnetic solution. Aqueous or organic solutions of magnetic inorganic salts may be used. Exemplary salts include salts based on the lanthanide cations, manganese chloride, manganese sulfate, iron chloride, iron sulfate, gadolinium chloride, gadolinium chelate salts and the like. The magnetic susceptibility of the paramagnetic organic salt solutions is approximately proportional to concentration. The spatial displacement leading to tilting depends, in part, on the density of the materials to be separated, the density of the supporting solution, the magnetic susceptibility of the paramagnetic salt, along with the constant gradient ($\partial B_z/\partial z$) of the magnetic system used. The closer the density of the paramagnetic solution matches the densities of the materials to be separated, the smaller the concentration of magnetic salt that is required for displacement. Similarly, the higher the magnetic susceptibility of the magnetic salts, the less is required to achieve displacement. In typical embodiments, concentrations ranging from 0.05 M-2.0 M are suitable.

In certain embodiments, a gadolinium salt is used. Exemplary $Gd^{3+}$ salts include $GdCl_3$, gadolinium(III)(diethylenetriaminepentaacetic acid) (Gd(DTPA)) and (gadolinium(III) diethylenetriamine triacetic acid tetradecane ($Gd(DT_3)$)). There are at least four characteristics of $Gd^{3+}$ cations that make them useful for detection of density differences: i) they (along with some of the other lanthanide cations) possess the largest magnetic susceptibilities ($\chi=+0.028$ cm$^3$/mol $GdCl_3$) of any ionic species; ii) they permit straightforward visualization of samples because their solutions are colorless; iii) they are compatible with proteins and cells when chelated (e.g., $Gd^{3+}$ DTPA complex); and iv) they have acceptable cost (salts of $Gd^{3+}$ can cost <$0.34/g salt=<$0.80/g $Gd^{3+}$=<$125.8/mol $Gd^{3+}$), and the solutions are reusable.

Since $\chi_p$ is negligible for all diamagnetic materials ($\chi_p \approx 0$), the magnetic force on a diamagnetic object is linearly proportional to the magnetic susceptibility of the paramagnetic solution ($\chi_1$ in Equation 2). $Gd^{3+}$ generates a large magnetic force for a given concentration of cations and value of applied magnetic field than other transition metal cations. The large magnetic susceptibility of $Gd^{3+}$ (compared, for example, to the susceptibilities of other lanthanide cations), enables the system to levitate particles with greater density for an equal concentration of paramagnetic cations, and/or to levitate a given particle using a lower concentration of paramagnetic ions.

In certain embodiments, the paramagnetic solution can be provided with suitable additives, such as alcohols, salts, sugars, or any soluble organic or inorganic material, that can adjust the density or buoyant force of the paramagnetic solution. Adjustments of the paramagnetic solution with suitable additives can be selected to match the particular objects to be assembled, based on the objects' density, magnetic susceptibility, solvent compatibility, and the like.

In certain embodiments, 3D self-assembly is achieved by combination of one or more of the embodiments described herein. For example, by controlling orientation, levitation height, suitable templates, and suitable annealing techniques, desirable 3D structures can be formed that are then affixed so that the 3D structure remain in the absence of a magnetic field.

Useful devices and methods can be fabricated that utilize the MagLev 3D self-assembly concepts. Exemplary applications include optical devices using self-assembled MagLev components, novel mechanical structures, novel photonic structures, and the like.

Other numerous applications will be readily apparent to one of ordinary skill in the art.

Advantages of MagLev for 3D Self-Assembly (SA)

MagLev exhibits numerous different characteristics that make it particularly attractive as a strategy for 3D self-assembly of mm-scale objects.

First, MagLev is not limited to surfaces, and avoids some of the limitations imposed by gravity in conventional self-assembly.

In certain embodiments, MagLev is simple. Generating patterns of magnetic field gradient with permanent magnets and patterns of density with layers of polymers and adhesive is easy and inexpensive.

In some embodiments, MagLev self-assembly can use components from a wide range of materials. For example, even when using a simple, relatively low-field magnets, objects with densities between 1-3 g/cm$^3$ can easily be manipulated; this range includes most organic polymers.

In some other embodiments, MagLev is applicable to soft, fragile, and sticky objects (e.g., liquids, gels, pastes, etc.); such objects are otherwise very difficult to handle. Particularly, because self-assembly takes place in a fluid, the components do not need to contact solid surfaces. Moreover, fluidic suspension can eliminate dry friction, stiction, contact adhesion, and static charging.

Self-assembly can proceed inside an entirely closed container.

In certain embodiments, composite objects can be assembled from several different materials.

In certain embodiments, multiple components with different sizes, shapes or properties can self-assemble into asymmetrical, ordered structures using MagLev.

In yet other embodiments, MagLev can be adapted to a wide range of problems in self-assembly because it is influenced by a number of independently controllable parameters (the densities and shape of the objects, the density and magnetic susceptibility of the paramagnetic liquid, the shape of the magnetic field, the shape of the container, and other readily controlled parameters such as temperature and pressure). Particularly, such easily tuned parameters can direct objects into specific regions of 3D assemblies and further control their position and orientation in 3D space.

Additionally, changing the magnetic field can change the position and orientation of all components; a number of components can thus be manipulated in parallel.

Moreover, MagLev can induce self-assembly over convenient time-scales (the time it takes to form well-ordered structures using mm-scale objects is on the order of seconds to minutes).

In some embodiments, the ability to anneal the self-assembled structures by mechanical agitation is also useful.

In certain embodiments, self-assembly based on MagLev can be made reversible to minimize the density of defects in the assembled clusters. Moreover, self-assembly based on MagLev can be easily disassembled by the removal of magnetic field.

In some other embodiments, the ability to further lock in the structure (e.g., use of photoinitiated adhesives, removal of the MagLev fluid or magnetic field) after achieving three-dimensional assembly in the fluid can provide yet another variable in achieving the desired self-assembly in three dimensions.

In certain embodiments, devices for MagLev can be easily modified to expand the range of structures and objects that can be self-assembled. Devices that generate higher fields and field gradients can be used to self-assemble objects that have a higher density or that have smaller sizes. The magnetic fields can be easily altered, for example, by use of permanent magnets with different shapes, or using soft ferromagnetic-field concentrators, or addition of electromagnets, or series of electromagnets, or certain combinations.

Lastly, external power is not required in many procedures.

EXAMPLES

Experimental Design

The repulsive force exerted by non-uniform magnetic fields on diamagnetic materials is typically negligible for most materials, and is insufficient to suspend them against gravity in air using permanent magnets (bismuth and graphite are exceptions, but the strength of their repulsion from a region of high field is still small compared to the strength of attraction of most paramagnetic objects). A simple strategy for achieving MagLev of diamagnetic objects with permanent magnets is to suspend these objects in a paramagnetic fluid, and to place that fluid in a magnetic field gradient generated using two magnets oriented with like poles facing each other. In this arrangement, the paramagnetic medium is attracted towards the regions of high magnetic field, and displaces the diamagnetic object towards regions of lower magnetic field; this exchange of paramagnetic matter for diamagnetic in regions of high magnetic field enables magnetic levitation.

The NdFeB magnets utilized are inexpensive (~$20 when purchased individually and significantly less in bulk), and generate large magnetic fields (remnant field, $M_R$=1.1 kA/m and field at the magnet surface~0.4 T). Their large coercivity ($H_C$=1.1 T) makes them resistance to demagnetization when multiple magnets are used in an anti-Helmholtz arrangement. Two rectangular prism-shaped magnets in an anti-Helmholtz configuration generate a region of low magnetic field between the magnets—an oblate-spheroid-shaped "magnetic bottle"; this configuration is especially useful for 3D self-assembly for three reasons. First, the system centers and aligns levitating diamagnetic objects or clusters along a vertical centerline between the magnets (vertical dotted line in FIG. 1A)), because the magnitude of the magnetic field is minimal in that region of the x-y plane. Second, it levitates objects that are either more dense or less dense than the paramagnetic solution; objects that are more dense than the medium sink in the absence of the magnetic field, and their levitation is enabled by the bottom magnet; objects that are less dense than the medium float in the absence of an applied magnetic field, and their levitation (or "reverse levitation") is enabled by the top magnet. Third, the magnetic field gradient can be easily altered by changing the distance between magnets.

The paramagnetic solution enables levitation in two ways: i) it provides a buoyant force that counteracts gravity, and ii) it controls the magnitude of the magnetic force experienced by the paramagnetic medium, and thus contributes another force to those experienced by the diamagnetic objects.

Details of the Mag Lev Device

Permanent NdFeB magnets (Grade N50, shaped as rectangular prisms with dimensions of 2 in×2 in×1 in, supplied by K&J Magnetics) with a surface field of ~0.4 T generated the magnetic field. Some NdFeB magnets (square prisms: grade N50, 2 in×2 in×1 in, Model # NB063-N50; rectangular prisms: grade N42, 4 in×2 in×1 in, Model# NB079) were purchased from Applied Magnets (www.magnet4less.com). The magnets were held at a distance of 20-70 mm (the distance between the magnets could be adjusted) in an anti-Helmholtz arrangement within an aluminum casing. The aluminum casing for the magnets was designed and fabricated by Gaudreau Engineering (West Warwick, R.I.) for a fee.

All chemicals were purchased from Sigma-Aldrich (Atlanta, Ga.) and used without further purification, unless noted otherwise.

All plastics, polymeric sheets, and tapes were purchased from McMaster-Carr (Princeton, N.J.; www.mcmaster.com), unless noted otherwise.

Sheets of polymethylmethacrylate (PMMA) were purchased from Astra Products (Baldwin, N.Y.; www.astraproducts.com).

Sheets of polystyrene were purchased from Utrecht (Cambridge, Mass.; www.utrechtart.com).

Polyvinyl chloride tape (PVC) and aluminum tape were purchased from McMaster-Carr (Princeton, N.J.; www.mcmaster.com).

Scotch® Double-Sided Carpet Tape (CT 2010) was purchased from 3M. Mirrored mylar tape was purchased from The Band Hall (Nashville, Tenn.; www.thebandhall.com).

Masking and labeling tape was purchased from VWR International.

A plastic Fresnel lens was purchased from Edmund Industrial Optics (Barrington, N.J.), and a convex lens from Thorlabs (Newton, N.J.; www.thorlabs.com).

Plastic diffraction gratings and a red laser pointer were purchased from Edmund Scientific's (Tonawanda, N.Y.; www.scientificsonline.com). A 100 mW green laser was purchased from Wicked Lasers (www.wickedlasers.com) for demonstrating the function of levitating optical components.

Computation

COMSOL Multiphysics (provided by COMSOL AB) was used to model and visualize the magnetic field and the gradient generated in the MagLev device.

Mechanical Agitation

The motor (RadioShack 3VDC micro vibration motor, item #273-0107) rotates an unbalanced shaft at frequencies up to 16000 rpm with the application of a 3V DC current. It was affixed to the container using epoxy glue; the container was loosely held in the MagLev device so as to not dampen the vibrations.

Example 1

Self-Assembly of Spheres in the Absence of Rigid Templates 1.0-1.5 M $MnCl_2$ ($\chi_m=7\times10^{-4}$) solutions in water ($\rho=1.10$-1.15 $g/cm^3$) was used for levitation, and non-ionic surfactant (0.1% v/v Triton X-100 or Tween20) was added to reduce friction and hydrophobic interactions between objects and thus to reduce defects in assembly. Solutions of $MnCl_2$ in water have high magnetic susceptibility ($\chi_m \approx 10^{-3}$ for solutions≈4 M and decreases linearly with concentration), and low cost (<$0.05/g for quantities used in a lab experiment, and significantly less in bulk). They enable levitation of objects that range in density from 1-2 $g/cm^3$ (and up to 3 $g/cm^3$ with $MnBr_2$ and/or addition of other diamagnetic co-solutes, such as $CaCl_2$ or $ZnCl_2$; the added $Ca^{+2}$ or $Zn^{+2}$ diamagnetic ions do not significantly change the susceptibility, but the dissolved salt changes the density of the solution). This range of densities is well-suited for levitating most organic polymers.

Spherical objects were used as components. Spherical objects are well-suited for initial experiments because surface interactions between two spheres are minimal; strong surface interactions may inhibit sliding of objects towards the equilibrium structures, and can lead to the formation of kinetically trapped, metastable structures.

Polymethylmethacrylate (PMMA, density=1.19 $g/cm^3$) was used for the diamagnetic components; this polymer is homogeneous, inexpensive, commercially available in many shapes and sizes, and easily machined. Laser cutting generated non-spherical objects from sheets of PMMA.

The assembly of multiple components into ordered, equilibrium structures usually requires agitation. The less stable aggregates formed initially was annealed into more stable structures by mechanically agitating the container (various prism-shaped boxes, 2-8 cm in length), using an attached, unbalanced micro-motor (the kind that produces vibrations in a cell phone). This rotor produces vibration at 250 Hz; the vibrations are transmitted through the liquid and agitate the cluster.

Figure 2:
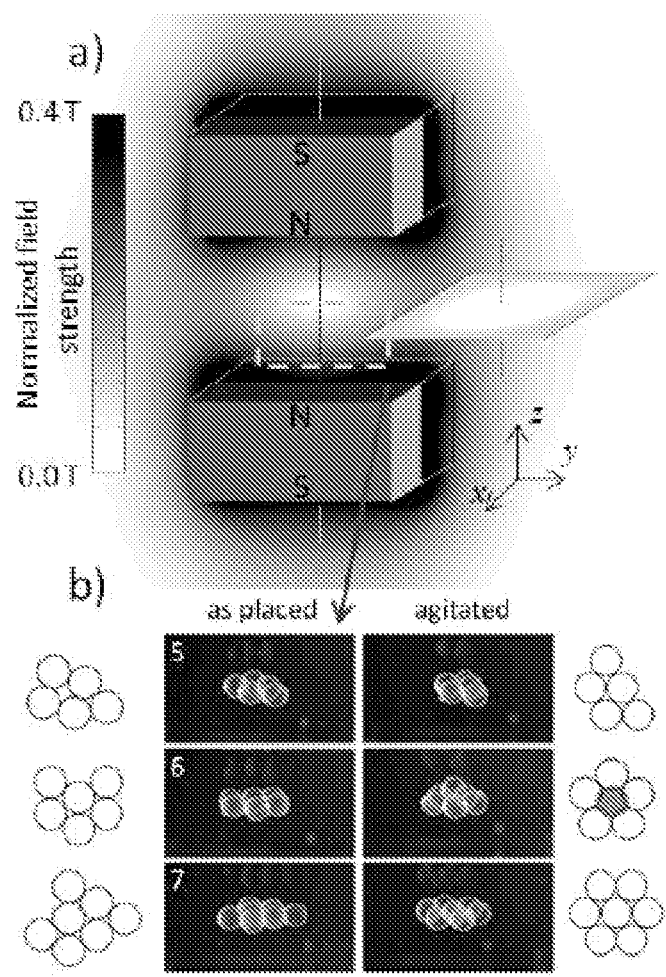
FIGS. 2a and 2b shows a schematic of the experimental design for MagLev and photographs of clusters of levitating PMMA spheres in accordance with certain embodiments.

The magnetic field gradient creates a "magnetic bottle" that traps levitating objects; the shape of this bottle (or "magnetic template") determines how multiple levitating objects pack within it. FIG. 2 illustrates the self-assembly of clusters of spheres within a magnetic template produced by the MagLev device.

Non-agitated clusters to those annealed with mechanical agitation are compared. The left column shows examples of clusters that form as-placed in the device, and the right column shows the same cluster after mechanical agitation for two minute.

More specifically, the left column of FIG. 2B shows examples of clusters of spheres that formed spontaneously after placing the spheres in the container filled with the paramagnetic medium, allowing them to sink, and positioning the container between the magnets within the MagLev device. Horizontal sheets formed without agitation for clusters consisting of up to seven spheres (FIG. 2B, left column) for all sphere sizes used in the experiments (0.06 in-0.25 in/1.6 mm-6.4 mm in diameter). As-placed clusters form sheets that, for fewer than eight spheres, are generally, but not always close-packed (contrast the cluster with five spheres to the clusters of six and seven sphere). In this case, the magnetic field essentially provides a very shallow bowl with a slight magnetic "rim" around the region where the spheres are levitating, and permits the formation of the flat horizontal sheets shown in FIG. 2B, left column.

Agitation, either manually (by tapping) or by vibrating the container promotes the formation of ordered clusters (FIG. 2B, right column). In one particular instance, the sixth sphere in the middle of the right column lies above the plane of the other five and is shown shaded in the schematic.

Sheets comprising eight or more spheres experience lateral magnetic forces from the "rim" that push spheres (1.6 mm-6.4 mm in diameter) at the margins toward the center and prevent the expansion of the ordered sheets upon addition of spheres; these clusters remain disordered even after 10 minutes of mechanical agitation. To increase the size of a stable flat cluster, the magnet-to-magnet distance was increased to 70 mm, and thereby extended the template laterally and flattened it (the local curvature around the centerline was reduced; compare the COMSOL simulations of the magnetic field shape in FIG. 3). In this configuration, planar close-packed sheets of up to nine spheres (0.06 in-0.25 in/1.6 mm-6.4 mm in diameter) form.

Figure 3:
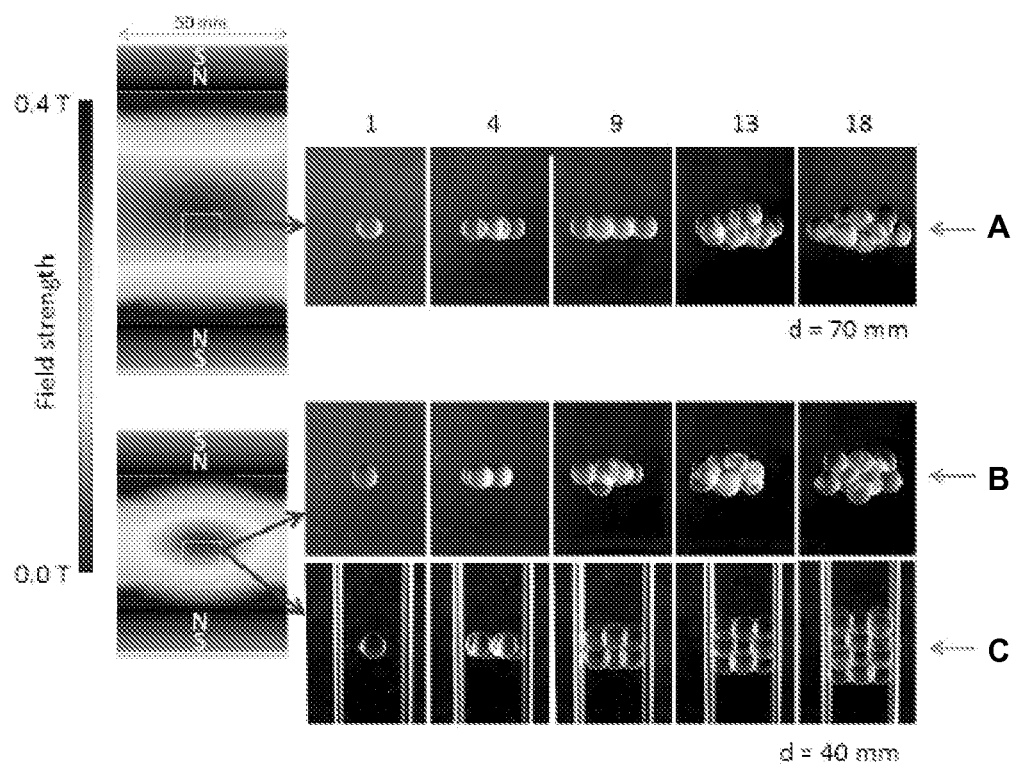
FIG. 3A-C shows photographs showing the progressive formation of a self-assembled cluster as spheres are added from above in accordance with certain embodiments.

Freely-levitating clusters comprising ten or more spheres (1.6 mm-6.4 mm in diameter) did not form a well-ordered cluster when mechanically agitated in this MagLev device, even at the larger magnet separation; the cluster, however, levitated such that its center of mass remained at constant height, and additional spheres increased the thickness and lateral extent of the cluster (FIG. 3).

In FIG. 3, numbers given as column headings denote the number of spheres in the cluster. Arrows point to the center of mass of the levitating clusters. As shown, the center of mass of the crystal levitates at constant height. Magnet-to-magnet separation is denoted as d (40 and 70 mm). The shape of the clusters follows the shape of the magnetic trap, with the flattening of the cluster apparent as the distance between the magnets is increased (COMSOL calculations are shown on the left).

The bottom row of FIG. 3 shows the addition of a container (standard cuvette, 10 mm wall-to-wall distance) that induces FCC packing in the clusters, in contrast to the less-ordered clusters induced by magnetic template alone.

Example 2

Self-Assembly of Spheres in the Presence of Rigid Templates

The formation of well-ordered clusters of more than seven spheres was assisted by the use of a rigid physical template (or the use of larger magnets at a larger separations); physical templates were utilized to order larger clusters and to induce alternate (non-close-packed) ordering. Solid objects act as templates for the self-assembly of levitating spheres by providing a surface along which the spheres can pack. Contact between a flat surface and aggregates of spheres leads to the hexagonal packing of those spheres in direct contact with the template; agitating these levitating objects extends this order through the cluster (including to those spheres not in contact with the template). Two different types of templates are demonstrated: i) the flat walls of a container, and ii) co-levitating objects.

FIG. 4A shows a cluster of 60 spheres that do not crystallize at any magnet-to-magnet distance, using the magnetic template alone. However, any rigid flat surface that comes in contact with the cluster act as a template and can induce ordering in the cluster. For example, bringing a cluster of 60 spheres into contact with the wall of the container, with agitation, promotes the formation of a face-center cubic packed multilayer cluster (FIG. 4B). As shown in FIG. 4B, by bringing the clusters in contact with the wall of the container and applying agitation, fcc ordering, and an observable crystallized structure emerged.

Addition of rigid objects that levitate in contact with the cluster induces ordering in otherwise disordered clusters (FIG. 5A), and, by properly designing the levitating template, different lattices and structures can be formed. Two types of templates discussed above are demonstrated: i) 'enveloping templates' induce order by wrapping around the cluster; ii) 'displacing templates,' displace spheres occupying the lowest regions of magnetic field within the magnetic trap.

For example, co-levitating flat plates with agitation induce crystallization in aggregates of 70 spheres (FIG. 5A). FIG. 5A shows that fcc ordering in the freely levitating cluster can be promoted by the addition of a flat, rigid co-levitating template (PMMA disks in the image). On the right, two disks were first designed and fabricated to levitate at different heights by applying polytetrafluoroethylene tape (bottom disk) and polyvinyl chloride tape (top disk). The structures obtained were reproducible: the exact location of the spheres varied, but the packing and the general shape of the cluster always remained the same.

FIG. 5B show examples of co-levitating enveloping templates, such as a co-levitating triangular, rectangular and circular frame with the same density as the spheres being templated (FIG. 5B). Interestingly, the rectangular frame induced rectangular packing of the spheres. The enveloping frames were laser-cut PMMA templates ordering 1/8-in/3-mm diameter spheres.

Figure 5:
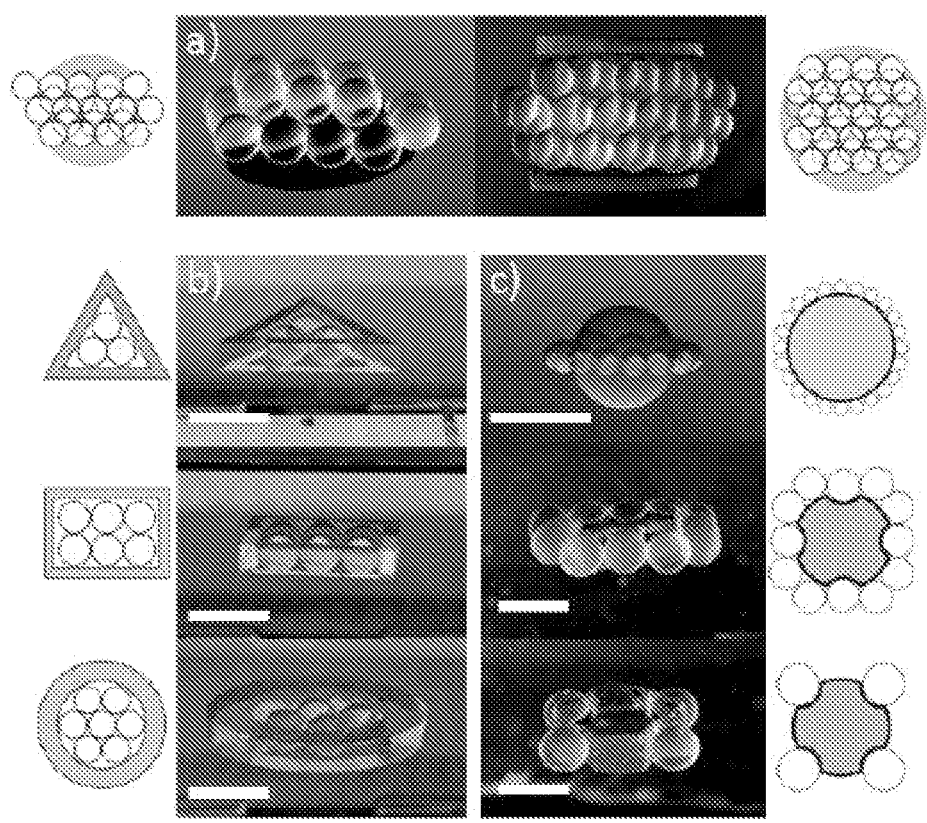
FIG. 5a-5c shows photographs of levitating spheres ordered by co-levitating templates in accordance with certain embodiments.

FIG. 5C show examples of co-levitating displacement templates. The surfaces and edges of levitating objects can also induce ordered packing of other objects around them (FIG. 5C). The top image of FIG. 5C shows a 1/4-in/6.4-mm diameter PMMA sphere templating the assembly of 1/16-in/1.6-mm diameter spheres. The middle is a notched template that locks the position of twelve 5/32-in/4-mm diameter spheres with respect to one another, and the bottom is the same template with four spheres. The scale bars are 1/4-in/6.3 mm in all photographs of FIG. 5.

To generate the structures shown in FIG. 5, both the spheres and the templates are placed simultaneously into a container filled with a paramagnetic medium, and positioned the container in the magnetic field.

Levitating templates provide a degree of control and freedom in designing self-assembling structures not available to other methods of self-assembly. Enveloping and displacing templates can be co-levitated simultaneously to create complex multi-component structures.

In certain embodiments, the container walls can be utilized as templates to induce three-dimensional packing using objects that have the same density. FIG. 6A shows face-centered-cubic arrangement of 5/32-in/4-mm diameter PMMA spheres in a vertical container. FIG. 6B shows simple-cubic arrangement of 3/16 in/4.8-mm diameter PMMA spheres in a vertical container. FIG. 6C shows body-centered-cubic arrangement of 3/16 in/4.8-mm diameter spheres with a 1/16-in/1.6-mm diameter sphere in the center; additional 1/16-in/1.6-mm diameter spheres tend to cluster around the center region. FIG. 6D shows a monoclinic arrangement of 3/16-in/4.8-mm diameter spheres in an angled container. Inner width (wall-to-wall) of the container is 10 mm. As shown, different packing geometries can be formed by proper selection of the container walls that serve as templates and the size of the spheres.

Example 3

Self-Assembly of Complex Structures from Components with Different Densities

By using components with different average densities, the vertical placement of the levitating objects with respect to one another can be controlled. This control enables the self-assembly of more complex structures by a process analogous to a layer-by-layer assembly. FIG. 7A illustrates multiple levitating objects with different densities that have self-assembled into layered structures according to their density. In the absence of additional mechanical templates that restrict the positions of components, the shape of the magnetic template controls the structure of each layer. FIG. 7A shows non-templated spheres assembled into separate layers based on density: (from bottom to top) black spheres are neoprene, gray spheres are Torlon, and light gray is polyvinylchloride spheres of 1/4-in 1.6-mm diameter.

Figure 4:
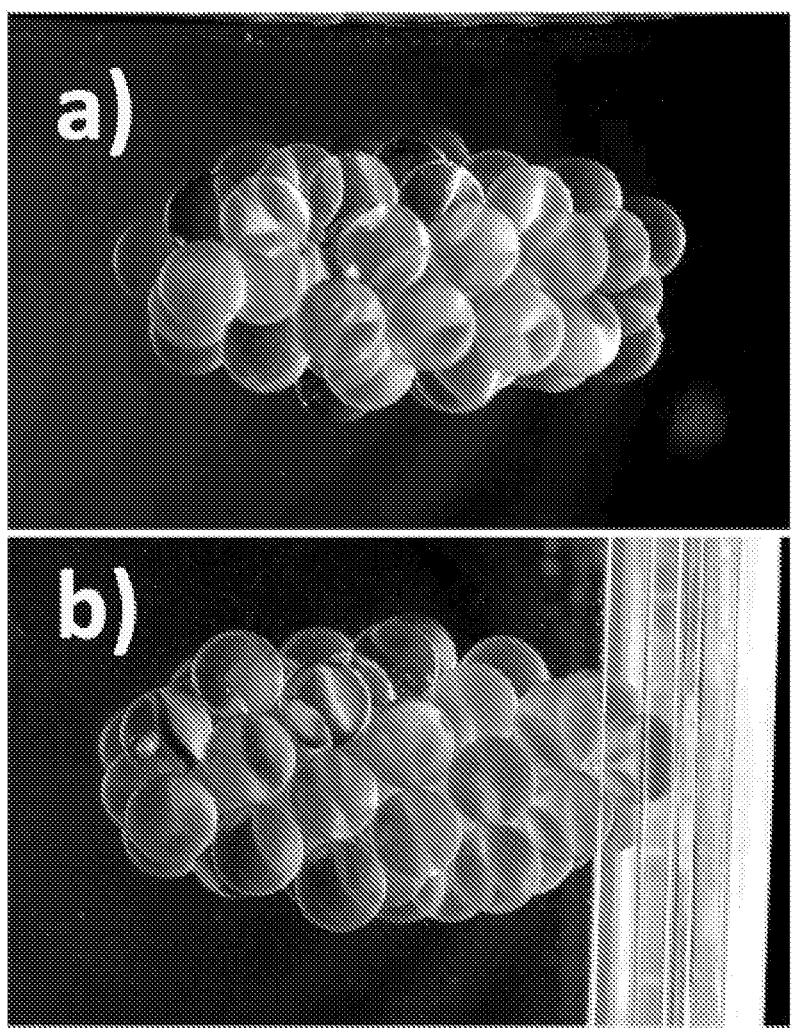
FIGS. 4a and 4b shows a cluster of spheres without any agitation at a) and with agitation at b) in accordance with certain embodiments.
Figure 6:
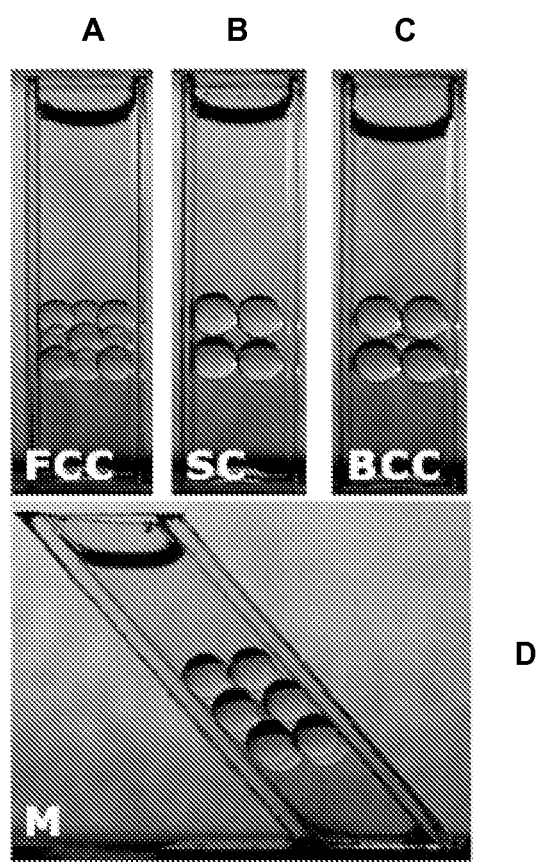
FIG. 6A-D shows photographs demonstrating the concept of density-based separation and self-assembly of multiple objects in accordance with certain embodiments.
Figure 7:
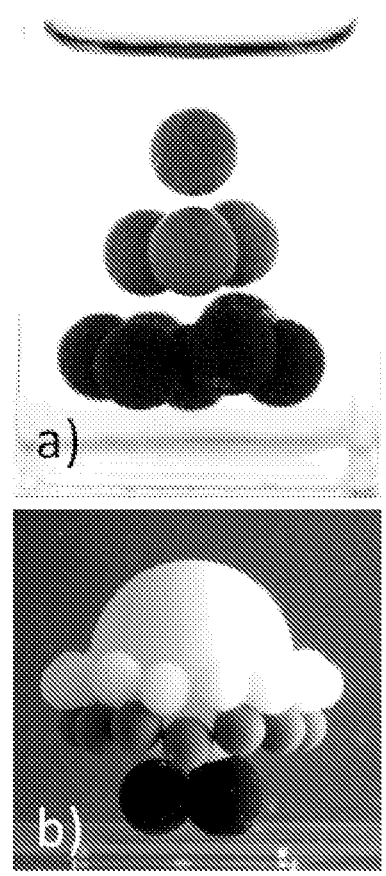
FIGS. 7a and 7b shows photographs of different lattices of packed spheres formed by controlling the ratio of the size of the container to the size of the components in accordance with certain embodiments.

The introduction of a physical template, in the form of a wall or co-levitating object, induces order in the separated clusters (FIG. 4, FIG. 6, FIG. 7B). FIG. 7B shows a 1/4-in/6.3-mm diameter Delrin sphere that simultaneously template 1/16-in 1.6-mm diameter Delrin spheres around its equator (white) and Torlon spheres (gray) below them, and 5/64-in/2 mm-diameter rubber spheres (black) at its bottom pole.

In another experiment, adhesive-backed polytetrafluoroethylene tape (purchased from McMaster Carr) was applied to acrylic sheets which were then laser cut to produce the rectangular slabs with pre-drilled positioning holes for the spheres. The tape is used to control the orientation and levitation height of individual components. The spheres (PMMA, polystyrene and Torlon, purchased from McMaster Carr) with 1/8-in diameter were manually positioned and glued in place using cyanoacrylate glue.

Figure 8:
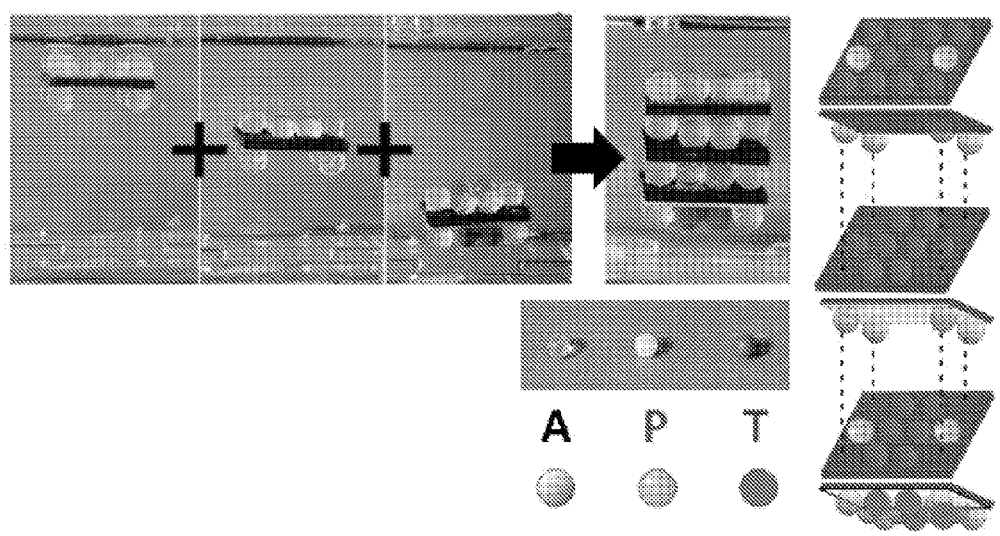
FIG. 8 shows the self-assembly of complex objects that are programmed by patterning the density of the levitating objects in accordance with certain embodiments.

FIG. 8 demonstrates several uses of this method to program the assembly of complex structures. As shown, interlocking pieces were prepared by gluing polymer spheres to prepare 13×8 mm acrylic sheets (red). White layers are adhesive-backed Teflon. Each object is programmed to levitate at a different levitation height when placed in the same container together; after the objects self-aligned by placing the container in the magnetic field, the magnet-to-magnet distance was reduced from 60 mm to 30 mm to bring them into contact. The different spheres are: A—acrylic (PMMA), P—polystyrene and T—Torlon. The magnets were 3.5×2.5×1 in/89×64×25 mm. Several complex objects were prepared by gluing together spheres of different densities to sheets of acrylic before placing them in containers of paramagnetic solution. The objects self-assembled into layered structures directed by MagLev. Reducing the separation between magnets makes it possible to bring separate layers into contact.

Example 4

Joining Components in Clusters of Self-Assembled Structures

Practical applications usually require that structures be stable once self-assembled. To fix the self-assembly structures described here permanently, a photocurable adhesive was applied after self-assembly was complete. A portion of the paramagnetic solution (typically one-sixth to one-fifth of the volume) was removed and an emulsion containing photocurable adhesive (1:100 v/v of Norland Optical Adhesive 72 in the $MnCl_2$ solution used for levitating) was added slowly (over the course of 2 minutes) so as not to disturb the self-assembly cluster. The adhesive was allowed to coat the cluster for five minutes, and then exposed the solution to UV light to crosslink it. The objects were then removed and rinsed.

An emulsion containing photocurable adhesive was prepared by vortex mixing 1:100 v/v adhesive (Norland Optical Adhesive 72):$MnCl_2$ solution. After the spheres self-assembly, the emulsion was slowly added by hand via a syringe to the container as to not disturb the levitating cluster. The solution was gently mixed by withdrawing and returning liquid from the container. The container was left in the Maglev device undisturbed for five minutes to allow the glue to coat the cluster, and then exposed the solution to UV light for four minutes in a Uvitron Intelli-ray 600 W shuttered UV chamber at a lamp distance of 10 cm to crosslink the glue. The objects were then removed and rinsed in water.

Figure 9:
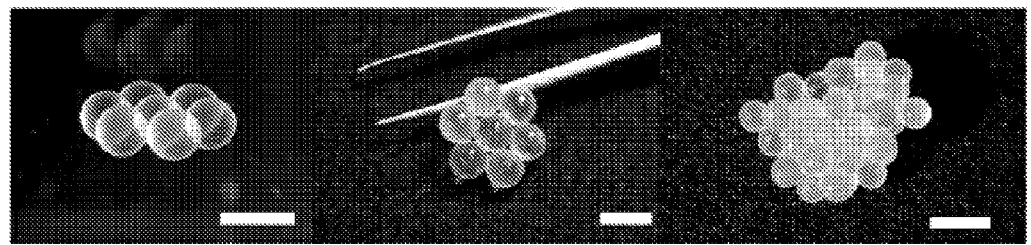
FIG. 9 shows self-assembled clusters of sphere that are glued permanently by introducing an emulsion of optical adhesive to the paramagnetic solution, allowing for the adhesive to coat the surface, and curing it under UV light in accordance with certain embodiments.

FIG. 9 shows the results of these experiments. The left figure shows a levitating cluster of seven 5/32-in/4-mm diameter spheres; the cluster was subsequently glued and removed from the solution, shown center. Right is a self-assembly cluster of 40 spheres that have been glued together. Scale-bars are 6.3 mm.

Example 5

Controlling Position and Orientation of Levitating Components with Patterns of Density FIG. 10A sketches the method utilized to fabricate mm-sized components with pre-programmed densities. Layers of different polymers were stacked (e.g., commercially available tapes and polymeric sheets) and bonded with thin layers of adhesive to pattern the density of the components. Then, a laser cutter was utilized to fabricate the desired shapes.

FIG. 10B demonstrates control over the vertical position of square slabs (10 mm on a side) levitating in 1 M $MnCl_2$ (left panel). The squares were fabricated from planar layers of polystyrene (PS) and polyvinyl chloride (PVC) tape with an adhesive backing Particularly, PVC tape was pressed against the surface of polystyrene and this polymer composite was manually cut using scissors into squares of 10 mm×10 mm. Tape (polyvinyl chloride, PVC, $\rho=1.40$ $g/cm^3$) introduced dense regions onto the surface of polystyrene (PS, $\rho=1.05$ $g/cm^3$). The number of layers of tape (FIG. 10B, right panel) determined the mean density and the height of levitation of each square.

Patterning the density of a slab controls its orientation relative to the gravitational vector (FIG. 10B-C). Flat squares with a uniform pattern of density along their square face orient perpendicular to the vector of gravity (FIG. 10B). FIG. 10C shows that patterning the square with specific density patterns of PS and PVC tape controls its orientation in the 1M $MnCl_2$ solution relative to the gravitational vector (i.e., tilted (45°) and vertical (0°)). The average density of the square determines its vertical position above the bottom magnet, and the distribution of densities on the square determines its tilt angle. To fabricate the components shown in FIG. 10C, polystyrene was cut into squares with dimensions of 10 mm×10 mm, and PVC tape into squares with dimensions of 8×10 mm using scissors. The PVC was then pressed against one surface of polystyrene to fabricate the components shown in FIG. 10C (left), and against both surfaces for component shown in FIG. 10C (right).

Example 6

Controlling the Orientation and Alignment of Components with Magnetic Forces Gravitational force is uniform over the entire volume of the container. Magnetic force directs the diamagnetic objects suspended in a paramagnetic medium away from regions of higher magnetic field towards regions of lower magnetic field; the direction of the magnetic force is along the gradient of magnetic field. Gradients of the magnetic field, therefore, allow diamagnetic objects to be positioned and aligned. Two easily manipulated parameters affect the gradient of the magnetic field: i) the shape of the magnets, and ii) the distance (d) between them.

Using magnets of different shapes controls the alignment of levitating objects in the XY-plane. FIG. 11A simulates the distribution of magnetic field in YZ- and the XYplanes for magnets that are square and rectangular prisms. Particularly, COMSOL simulation of the magnetic field in the YZ- and XY-planes for two shapes of magnets (square prisms with dimensions of 50×50×25 mm, and rectangular prisms with dimensions of 100×50×25 mm) separated by d=35 mm is shown.

Figure 11:
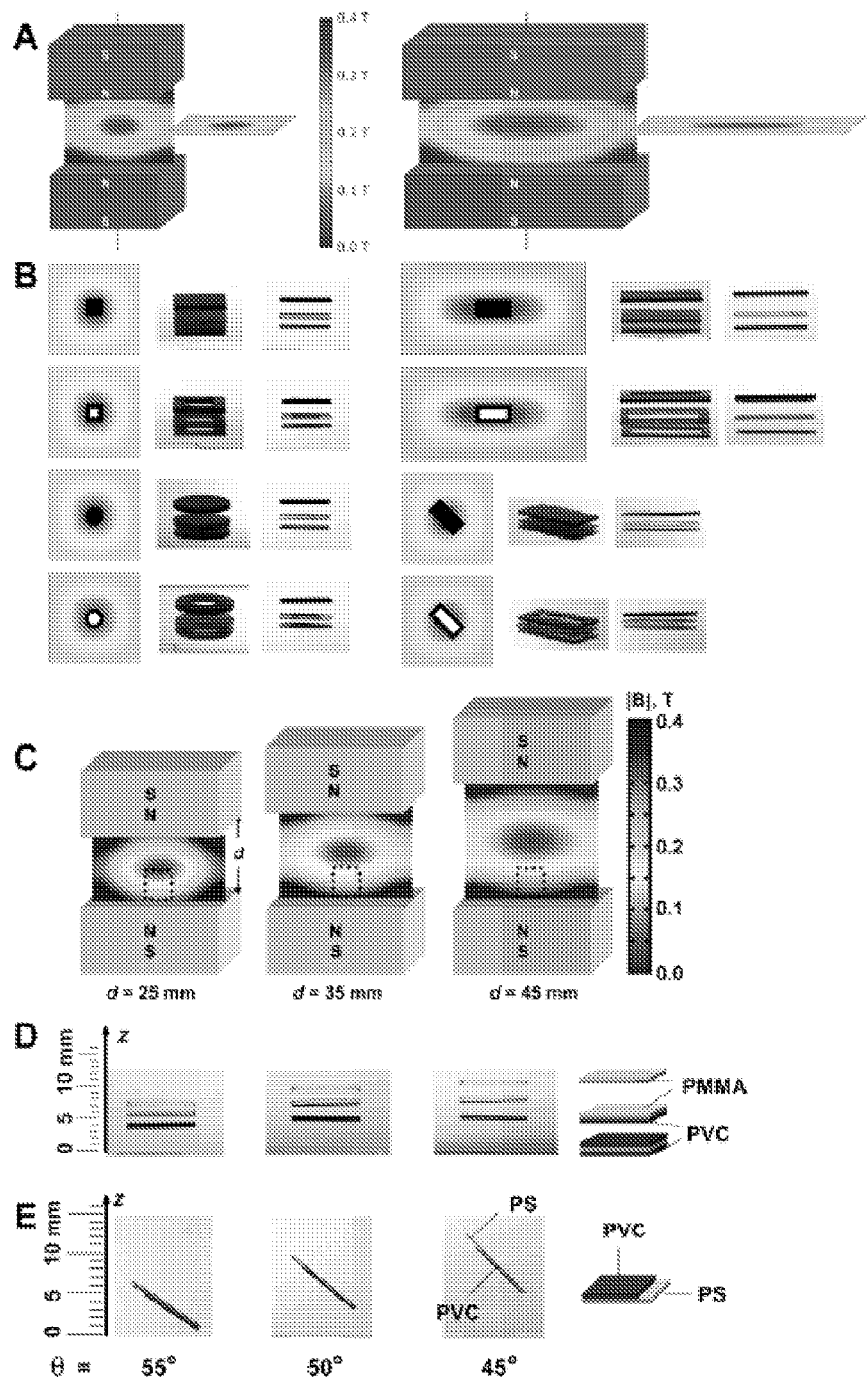
FIG. 11A-E shows schematics and photographs on how to control the position and orientation of object in a MagLev device in accordance with certain embodiments.

Components shown in FIG. 11 were fabricated from layers of PMMA and PVC and cut into specific shapes using a laser cutter (VersaLASER, Model VLS 3.5, Universal Laser Systems) using a general procedure shown in FIG. 10A. The component levitating at the top was made from red-colored PMMA (FIG. 11) having a thickness of 1 mm. The component levitating in the middle was made from a sheet of PMMA (0.5 mm thick) sandwiched between two layers of orange-colored PVC tape. The component levitating at the bottom was made from a sheet of PMMA (0.2 mm thick) sandwiched between three layers (one on top, and two on the bottom) of blue-colored PVC tape.

FIG. 11B shows the centering and alignment of several components of different shapes above the bottom magnet. The schematic shown to the left of each pair of photographs is a view of the simulated magnetic field from above the bottom magnet overlaid with an outline of the levitating shape. In each case, the experimentally observed position in the XY-plane qualitatively overlaps with the shape of the energetic minima suggested by the patterns of the magnetic field. The distribution of forces in the XY-plane determines the orientation of these objects with respect to the face of the bottom magnet. The photographs show an oblique view (center) and side view (right) of three levitating objects with indistinguishable shape but different density.

FIG. 11C-E demonstrates additional control over the vertical position, orientation, and spacing between levitating objects obtained by varying the distance between the magnets. In particular, simulation of the magnetic field in the YZ-plane at d=25, 35, and 45 mm is shown. Dotted square circumscribes the region occupied by levitating objects in panels B and C. FIG. 11D shows photographs of three squares (10×10 mm) fabricated from layers of PMMA and PVC levitating in 1.5 M $MnCl_2$. The density defines the vertical levitation height of each square, and the gradient of the magnetic field in the Z-direction (controlled by varying d) determines the vertical spacing between the squares. FIG. 11E shows photographs of a square with an asymmetric density pattern made from PS and PVC levitating in 1.0 M $MnCl_2$ at d=25, 35, and 45 mm. Varying the value of d alters the tilt angle of the square with respect to the gravitational axis.

Example 7

Self-Assembly of Components with Optical Function

Figure 12:
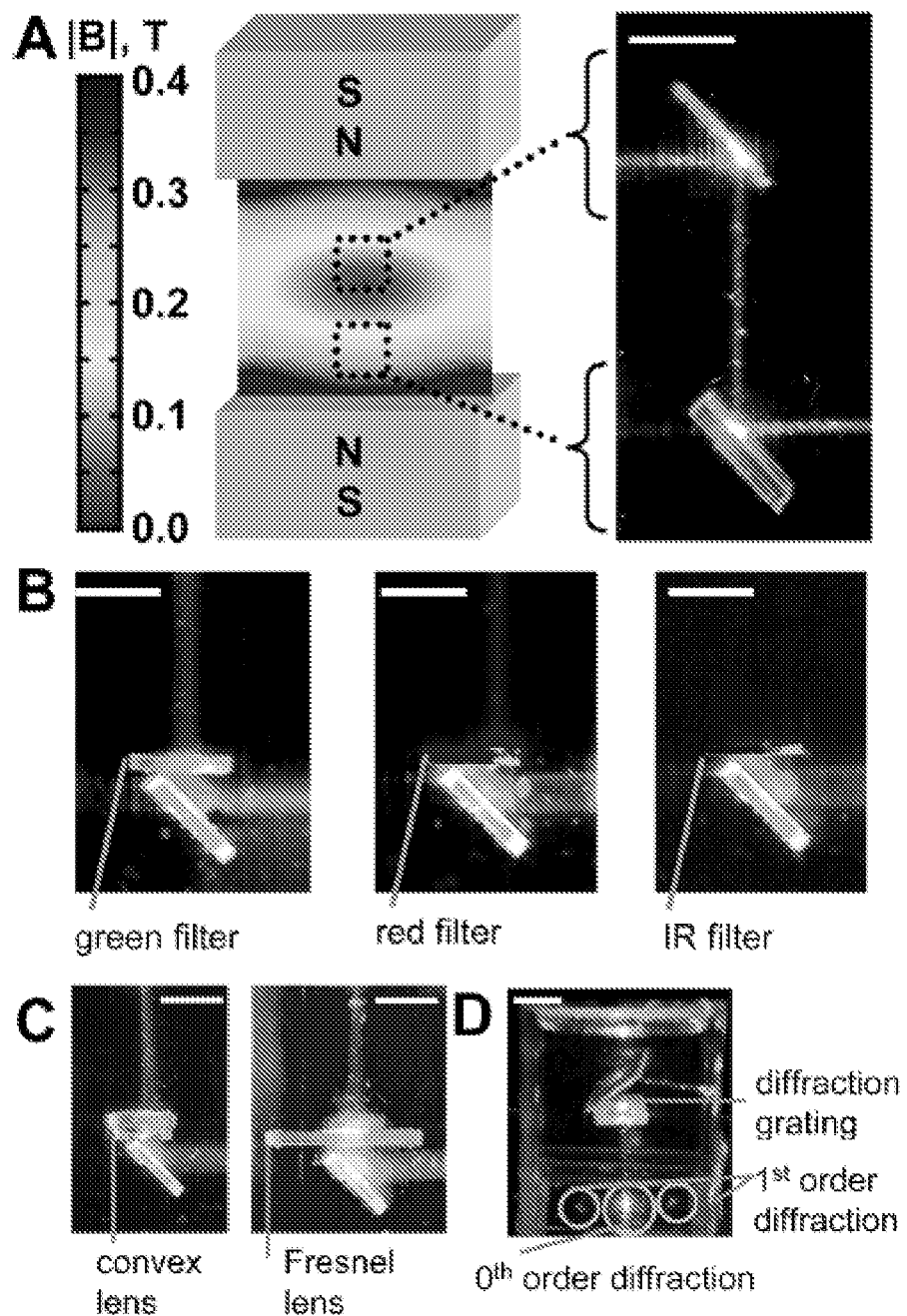
FIG. 12A-D shows photographs demonstrating alignment and position of optical components that direct a laser beam as desired in accordance with certain embodiments.

FIG. 12 illustrates the alignment and positioning of components using common optical elements (mirrors, filters, lenses). The components in this figure are all levitating independently (i.e., each one was programmed to levitate at specific position; there are no mechanical connections between them). Functionality of the optical system is illustrated by directing a laser at the assemblies. The scale bar in each photograph is 5 mm. This type of self-assembly has the useful feature that it also occurs in a completely closed container (see FIG. 13).

The levitating mirrors shown in FIG. 12A were fabricated by layering reflective Mylar tape onto the surface of PMMA.

To fabricate the mirror shown in FIG. 12A (top), mirrored mylar tape (The Band Hall, Nashville, Tenn.) was pressed against the surface of PMMA having a thickness of 0.2 mm, and used a laser cutter to cut a square of 7 mm×7 mm. The non-reflective surface of this object was then covered with two layers of masking tape with dimensions of 6 mm×7 mm.

To fabricate the mirror shown in FIG. 12A (bottom) mirrored mylar tape was pressed against the surface of PMMA having a thickness of 1.0 mm, and used a laser cutter to cut a square of 7 mm×7 mm. The non-reflective surface of this object was then covered with one layer of aluminum tape with dimensions of 5 mm×7 mm.

A plastic Fresnel lens (Aspheric Fresnel Lens, 0.6"×0.6", 0.2" FL, part number NT43-021) from Edmund Industrial Optics (Barrington, N.J.; www.edmundoptics.com), and plastic convex lens (part # CAY046) from Thorlabs (Newton, N.J.; www.thorlabs.com); these lenses were levitated without further modification.

Red and green filters were fabricated from red- and green-colored PMMA (1 mm thickness, Astra Products, www.astraproducts.com) by laser-cutting the PMMA sheet into circles with a diameter of 7 mm each. A PMMA-based IR filter was supplied by Astra Products, and cut into a 7-mm diameter circle using a laser cutter.

The pinhole was fabricated from PMMA-based IR filter (0.5 mm thickness, Astra Products, www.astraproducts.com) by laser-cutting the PMMA sheet into a square with dimensions of 6 mm×6 mm having a 0.5 mm hole at the center.

The mirrors shown in FIG. 12B were fabricated using an analogous process.

Squares of PMMA (7 mm×7 mm with a 4 mm×4 mm cutout window in the center) were utilized as supports for commercial plastic diffraction gratings (Edmund Scientific's, Tonawanda, N.Y.). To fabricate the diffraction grating, the surface of PMMA (0.5 mm thick) was covered with double-sided adhesive tape and cut the square using a laser cutter. Then the commercial plastic diffraction grating was pressed against the adhesive tape. The orientation of the lines of the diffraction grating with respect to the supporting PMMA square can be used to control the diffraction pattern when multiple gratings on square supports are aligned on top of one another by MagLev.

Because of the symmetry of the square magnets used for MagLev, tilted mirrors in FIG. 12A can have multiple configurations during levitation, and do not necessarily face with the reflective side towards the light source.

Tilting of the MagLev device breaks the symmetry of the system, and makes it possible to rotate the levitating mirrors, such that the heaviest part of the mirror faces the direction of tilt. Gentle re-leveling of the MagLev device then traps the mirrors in a specific orientation.

Figure 14:
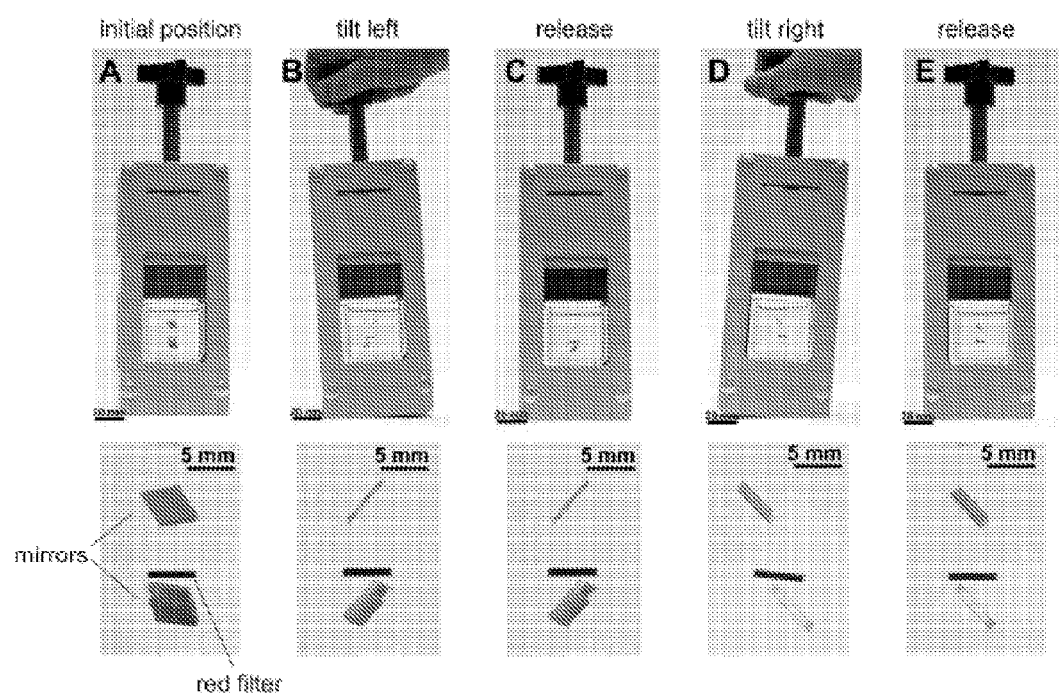
FIG. 14A-E shows photographs illustrating the use of tilting for controlling the orientation of levitating mirrors in accordance with certain embodiments.

FIG. 14 shows photographs illustrating the use of tilting for controlling the orientation of levitating mirrors. Photographs show two tilted mirrors and a red filter placed in between them for reference. A) Initial position of levitating objects introduced into the MagLev device. B) Tilting the device to the left rotates the mirrors with the heaviest part pointing towards the direction of tilt. C) Re-leveling the device traps the mirrors with the heaviest part pointing left. D) Tilting the device to the right rotates the mirrors with the heaviest part pointing right. E) Re-leveling the device traps the mirrors with the heaviest part pointing right.

Returning to FIG. 12, colored (green, red, and black) PMMA were utilized to fabricate light filters (FIG. 12B). Green PMMA transmits the light emitted by a green laser pointer, but absorbs the light from a red laser pointer; red PMMA transmits red light and absorbs green. A PMMA-based IR filter absorbs light emitted by both red and green laser pointers.

MagLev can also be used to manipulate lenses. FIG. 12C illustrates levitation of two commercially available PMMA lenses (Fresnel and convex) positioned above a mirror. The lenses focus light emitted by the laser pointer.

FIG. 12D gives an additional example of MagLev for arranging multiple objects in 3D, and demonstrates a mirror positioned above a diffraction grating. The mirror reflects the light through a transmissive diffraction grating. The grating diffracts light such that the $0^{th}$ and $1^{st}$ order diffractions are visible on the bottom of the container in which the objects levitate.

Figure 13:
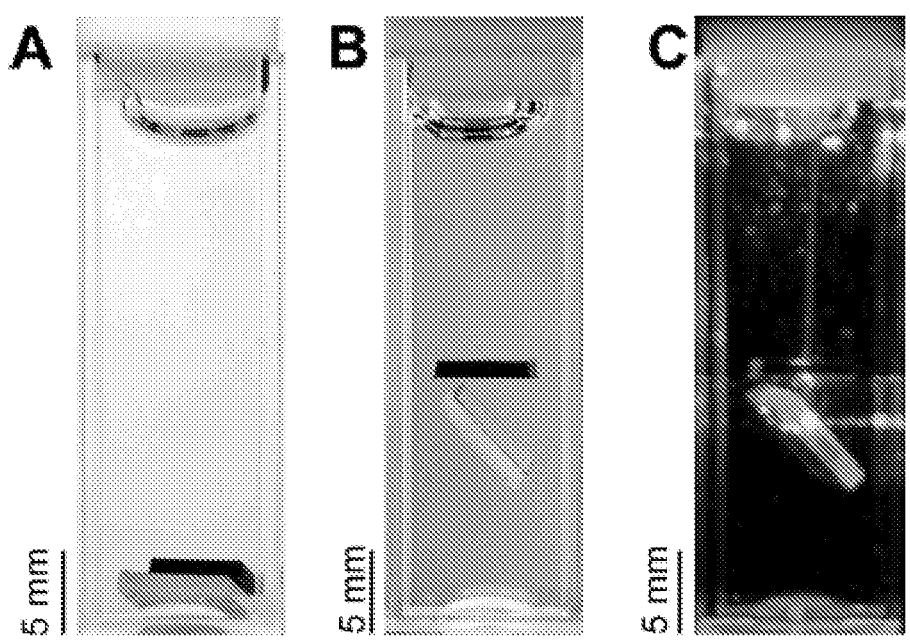
FIG. 13A-C shows self-assembly of a mirror and a pinhole in a MagLev device in accordance with certain embodiments.

FIG. 13 provides another example of an optical device that was formed by levitating a mirror and a pinhole in a MagLev device. FIG. 13A shows an image without an applied magnetic field, and FIG. 13B shows an image with an applied magnetic field where the mirror levitates at 45 degrees relative to the z-axis while the pinhole levitates at a slightly higher location at 90 degree orientation relative to the z-axis. FIG. 13C shows an image with a laser beam being bounced off the mirror and passing through the pinhole, demonstrating a different optical device that can be fabricated using MagLev of the present disclosure.

Example 8

Modification of the Magnetic and Gravitational Field Distribution

FIG. 14 shows how the assembled structures can be easily modified by altering the gravitation field distribution relative to the magnetic field distribution. As shown in FIG. 14A, at an initial position of the MagLev device, the mirrors and the red filter find their equilibrium levitation height and orientation as shown. When the MagLev device is tiled to the left (see FIG.

14B), because the gravitational field distribution is now altered relative to the magnetic field distribution, a new assembled structure is formed. When the tilt is released (see FIG. 14C), a new equilibrium structure is shown. Similarly, tilting to the right (see FIG. 14D) alters the structure differently yet again, only to return to the initial position (see FIG. 14E). Without wishing to be bound by theory, the structures shown in FIG. 14A, C, and D may be different as there are multiple minimum equilibrium structures at the "initial position" due to the shape of the magnetic field distribution.

Example 9

Magnetic Levitation of Soft Components

Figure 15:
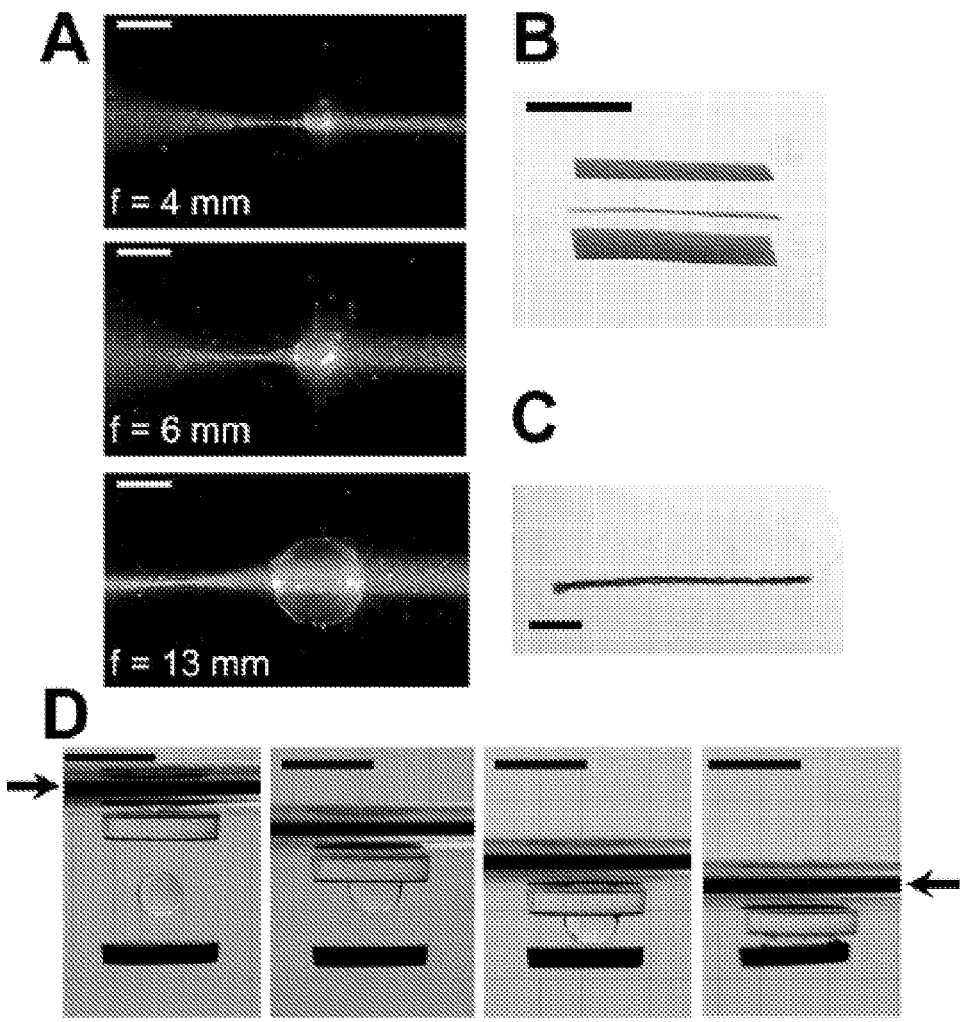
FIG. 15A-D shows photographs of levitating soft components in accordance with certain embodiments.

The ability of MagLev to suspend objects without contact with solid surfaces is a useful characteristic for manipulating fragile and soft components. FIG. 15 demonstrates several examples of levitation of components made from soft polymers and papers, and even liquids. FIG. 15A shows the levitation of droplets of benzyl alcohol of three different sizes (5, 25, 250 μL). The difference in refractive index between the aqueous paramagnetic medium (nD≈1.33) and benzyl alcohol (nD=1.54) and the smooth curved fluidic interface between the two liquids enable these droplets to act as ball lenses and focus light. The volume of the droplet determines the focal length of the lens.

MagLev makes it possible to orient and suspend soft sheets of wet paper on top of one another (FIG. 15B). Three layers of flat square cellulose-based sheets (top: nitrocellulose, middle: cellulose acetate, bottom: pure cellulose) levitating in aq. 3 M $MnCl_2$ is shown. The sheets maintain a flat shape during levitation.

MagLev also enables levitation of cotton thread in a linear conformation (FIG. 15C). As shown, a cotton thread assumes extended conformation during levitation in aqueous 3 M $MnCl_2$.

FIG. 15D illustrates the ability to combine soft and rigid components during levitation, and shows a droplet of 2-nitrotoluene levitating between two rigid PMMA-based disks. Draining of paramagnetic fluid (aqueous 1.5 M $MnCl_2$) from the container collapses the two disks onto the droplet. The arrows indicate the air-liquid interface.

Example 10

Organization and Assembly of Layered Structures by Compression

By positioning and aligning components in 3D, MagLev makes it possible to assemble multicomponent structures. The process involves two stages: (i) the balance of magnetic and gravitational forces acting on each of the components orders them into layered structures that are freely suspended in the paramagnetic liquid, and (ii) draining the liquid from the container stacks the components.

Figure 16:
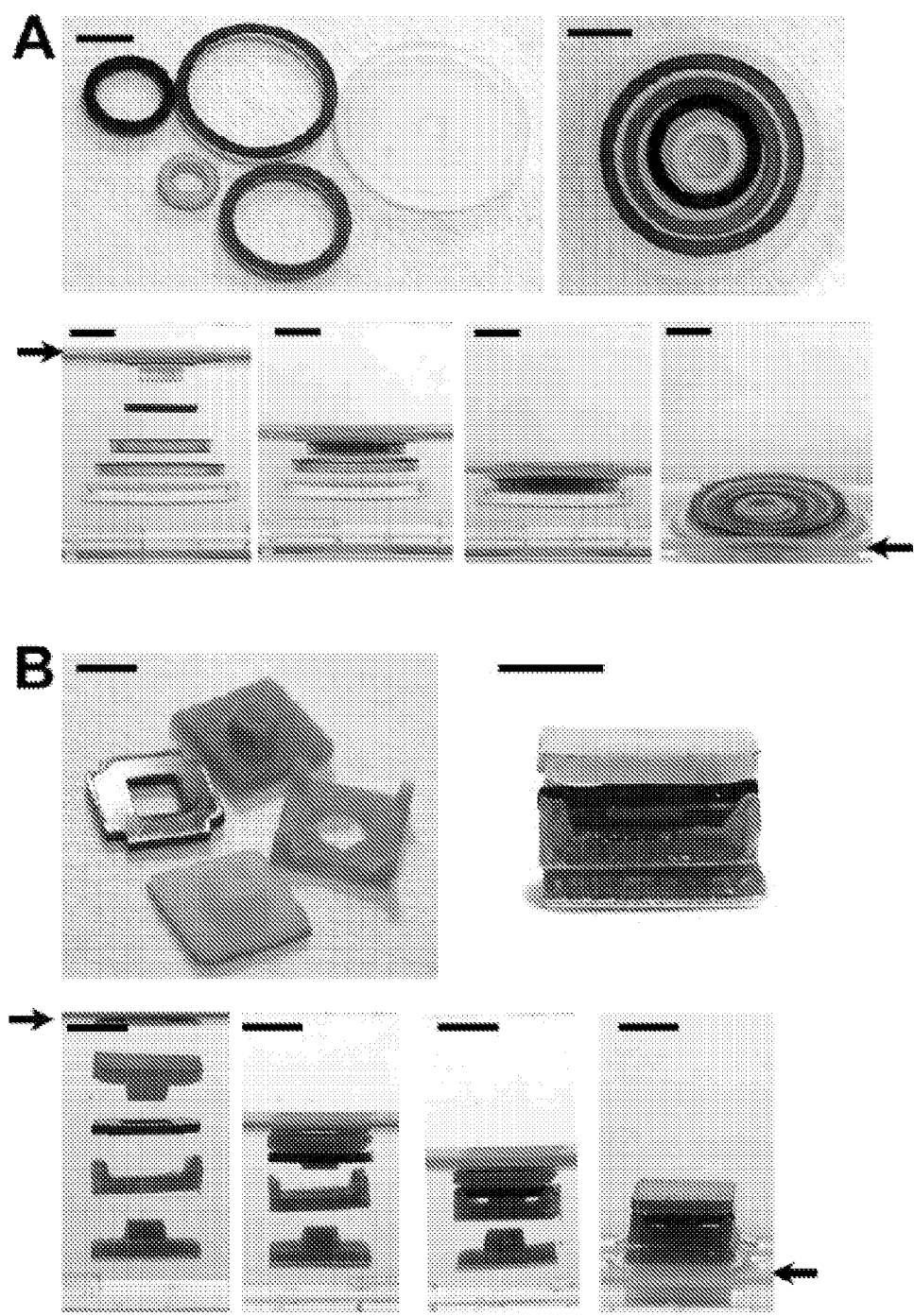
FIGS. 16A and 16B shows the assembly of multilayered structures by stacking multiple components in accordance with certain embodiments.

FIG. 16 shows two demonstrations of the assembly of multilayered structures by stacking in aq. 1.8 M $MnCl_2$. All scale bars are 5 mm in length. The assembly of concentric circles on top of a supporting base is shown in FIG. 16A, and the assembly of four interlocking components is shown in FIG. 16B.

FIG. 16A shows photographs of four circles and a circular base before (top left), after (top right), and during (bottom) the assembly by MagLev. Draining the paramagnetic medium from the container while the system remained in the applied magnetic field lowered the air-liquid meniscus, and deposited the centered, correctly sized concentric circles on top of the base.

FIG. 16B shows photographs of four components designed to interlock upon assembly (top left: before assembly, top right: after assembly, bottom: during assembly). Draining of the paramagnetic fluid promotes stacking of the components into a layered structure. The arrows indicate the air-liquid interface.

In each demonstration, the individual components were programmed based on their densities to levitate at specific heights, and to assemble into specific configurations based on shape. The shapes of the structures were designed using vector drawing software and fabricated by laser cutting from layers of PMMA and tape.

The interlocking structures were generated by placing components with programmed shape and density (see details below) into a plastic container filled with 1.8 M $MnCl_2$ and positioning the container in the MagLev device. The container was equipped on its side with a hole and tubing for draining the fluid. The fluid was removed manually using a syringe.

To fabricate the concentric circles shown in FIG. 16, various kinds of tapes were adhered to a PMMA sheet with a thickness of 1 mm, and cut the shapes out using the laser cutter. The following adhesive tapes were used: two layers of blue labeling tape (VWR International) for the first shape, none for the second shape (just red PMMA), a layer of orange PVC tape on one side and a layer of white Bytac® film (VWR International) on the other side for the third shape, a layer of blue PVC tape on one side and a layer of white polytetrafluoroethylene (PTFE) film with adhesive backing (0.005" in thickness, McMaster Carr) on the other side for the fourth shape. To fabricate the base a laser cutter was used to engrave a pattern that would collect the concentric circles on top of it, and cut it using a laser cutter. The base was fabricated from PMMA (1.5 mm thickness) adhered to two layers of PTFE film with adhesive backing (0.005" thickness).

The red interlocking square component was fabricated from red PMMA (1 mm in thickness, Astra Products) by laser cutting. Yellow, green, and blue interlocking square components were fabricated from colored PMMA (3 mm in thickness, McMaster Carr) by laser cutting and engraving. The levitation height of each component was programmed by layering adhesive tape/film onto the surface of PMMA prior to laser cutting. Two layers of yellow labeling tape (VWR International) for the yellow component, one layer of PTFE film (0.005" thickness) with adhesive backing for the blue component, and two layers of the same PTFE film for the green component were used.

What is claimed is:

1. A method of assembling two or more objects into a three-dimensional structure, comprising:
   introducing two or more diamagnetic objects into a paramagnetic solution, the paramagnetic solution comprising a paramagnetic material in a solvent; and
   applying a magnetic field to the paramagnetic solution to assemble the two or more objects into a three-dimensional structure; wherein
   each of said two or more objects has an overall density that levitates the components in a particular height within said magnetic field and at least one of the objects having a non-uniform density profile that orients the components in a particular orientation within said magnetic field.

2. The method of claim 1, further comprising a template in the paramagnetic solution near said two or more objects that provides a surface against which the two or more objects assemble.

3. The method of claim 2, wherein said template is a mechanical template that surrounds the two or more objects.

4. The method of claim 2, wherein said template is a mechanical template that displaces the two or more objects from occupying the natural equilibrium position within said magnetic field.

5. The method of claim 1, further comprising providing an annealing force during said applying a magnetic field to the paramagnetic solution.

6. The method of claim 5, wherein said annealing force comprises mechanical agitation.

7. The method of claim 1, further comprising affixing the two or more objects together after said applying a magnetic field.

8. The method of claim 7, wherein said affixing comprises providing a binding agent that binds the two or more objects.

9. The method of claim 8, wherein said binding agent comprises a photocurable agent, said method further comprising exposing said two or more objects and said photocurable agent to irradiation to bind said two or more objects.

10. The method of claim 7, wherein said affixing comprises removing the magnetic field that allows the plurality of components to interlock with each other.

11. The method of claim 7, wherein said affixing comprises draining the paramagnetic solution that allows the two or more objects to interlock with each other.

12. The method of claim 1, further comprising subjecting the assembly to a new set of assembly conditions after said applying a magnetic field.

13. The method of claim 12, wherein said modifying comprises providing a different magnetic field.

14. The method of claim 12, wherein said modifying comprises providing a different gravitational field relative to the magnetic field.

15. The method of claim 1, wherein the two or more objects are assembled to form an optical device.

16. The method of claim 1, wherein the at least one of the two or more objects include non-rigid components.

17. The method of claim 1, wherein the object having a non-uniform density profile is adjusted to have a predetermined density profile to obtain a desired tilt after said applying a magnetic field.

18. A method of assembling two or more objects into a three-dimensional structure, comprising:
   introducing two or more diamagnetic objects and a template into a paramagnetic solution, the paramagnetic solution comprising a paramagnetic material in a solvent; and
   applying a magnetic field to the paramagnetic solution to assemble the two or more objects; wherein
   each of said two or more objects has an overall density that levitates the components in a particular height within said magnetic field.

19. The method of claim 18, wherein a plurality of spherical objects are introduced into the paramagnetic solution.

20. The method of claim 18, wherein said template is a mechanical template that surrounds the two or more objects.

21. The method of claim 18, wherein said template is a mechanical template that displaces the two or more objects from occupying the natural equilibrium position within said magnetic field.

22. The method of claim 18, further comprising providing an annealing force during said applying a magnetic field to the paramagnetic solution.

23. The method of claim 22, wherein said annealing force comprises mechanical agitation.

24. The method of claim 22, wherein the two or more diamagnetic objects comprise a plurality of spheres and said annealing force increases packing order and density of the plurality of spheres.

* * * * *